US012575246B2

(12) United States Patent
Kim et al.

(10) Patent No.: US 12,575,246 B2
(45) Date of Patent: Mar. 10, 2026

(54) PIXEL AND DISPLAY DEVICE INCLUDING THE SAME

(71) Applicant: Samsung Display Co., LTD., Yongin-si (KR)

(72) Inventors: Jin Taek Kim, Yongin-si (KR); Sang Ho Park, Yongin-si (KR); Hyun Kim, Yongin-si (KR); Woong Hee Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 514 days.

(21) Appl. No.: 18/166,436

(22) Filed: Feb. 8, 2023

(65) Prior Publication Data

US 2023/0282796 A1     Sep. 7, 2023

(30) Foreign Application Priority Data

Feb. 21, 2022     (KR) ........................ 10-2022-0022306

(51) Int. Cl.
| | |
|---|---|
| *H10H 29/85* | (2025.01) |
| *H01L 25/075* | (2006.01) |
| *H10H 20/857* | (2025.01) |
| *H10H 29/39* | (2025.01) |
| *H10H 29/49* | (2025.01) |
| *H10H 29/80* | (2025.01) |

(52) U.S. Cl.
CPC ....... *H10H 29/857* (2025.01); *H01L 25/0753* (2013.01); *H10H 20/857* (2025.01); *H10H 29/39* (2025.01); *H10H 29/49* (2025.01); *H10H 29/832* (2025.01)

(58) Field of Classification Search
None
See application file for complete search history.

(56) References Cited

U.S. PATENT DOCUMENTS

| | | | |
|---|---|---|---|
| 12,199,229 B2 | 1/2025 | Li et al. | |
| 2022/0069003 A1 | 3/2022 | Lee et al. | |
| 2022/0181382 A1* | 6/2022 | Park | H10H 29/142 |

FOREIGN PATENT DOCUMENTS

| | | |
|---|---|---|
| KR | 10-2020-0085977 A | 7/2020 |
| KR | 10-2021-0008252 | 1/2021 |
| KR | 10-2022-0033544 A | 3/2022 |

* cited by examiner

*Primary Examiner* — Feifei Yeung Lopez
(74) *Attorney, Agent, or Firm* — Womble Bond Dickinson (US) LLP

(57) ABSTRACT

A pixel includes an emission area and a non-emission area, a first pixel electrode, a first intermediate electrode, a second intermediate electrode, and a second pixel electrode spaced from each other, first light emitting elements including a first end electrically connected to the first pixel electrode and a second end electrically connected to the first intermediate electrode, second light emitting elements including a first end electrically connected to the first intermediate electrode and a second end electrically connected to the second intermediate electrode, and third light emitting elements including a first end electrically connected to the second intermediate electrode and a second end electrically connected to the second pixel electrode. The second intermediate electrode includes a first portion opposing the first intermediate electrode, a second portion between the first pixel electrode and the second pixel electrode, and a diagonal line portion between the first portion and the second portion.

20 Claims, 17 Drawing Sheets

ALE: ALE1, ALE2, ALE3
LD: LD1, LD2, LD3
PE: PE1, PE2
OP: OP1, OP2
CTE: CTE1, CTE2
CTE1: CTE1a, CTE1b, CTE1c
CTE2: CTE2a, CTE2b, CTE2c

PIXEL AND DISPLAY DEVICE INCLUDING THE SAME

CROSS-REFERENCE TO RELATED APPLICATION

This application claims priority to and the benefit of Korean Patent Application No. 10-2022-0022306, filed on Feb. 21, 2022, the entire content of which is incorporated by reference herein.

BACKGROUND

1. Field

The present disclosure relates to a pixel and a display device including the same.

2. Description of the Related Art

Recently, as interest in information display is increased, research and development of a display device are continuously being conducted.

SUMMARY

Aspects and features of embodiments of the present disclosure are to provide a pixel (or a sub-pixel) capable of improving light output efficiency and a display device having the same.

According to one or more embodiments, a pixel may include an emission area and a non-emission area, a first pixel electrode, a first intermediate electrode, a second intermediate electrode, and a second pixel electrode spaced from each other, first light emitting elements, each of the first light emitting including a first end electrically connected to the first pixel electrode and a second end electrically connected to the first intermediate electrode, second light emitting elements, each of the second light emitting elements including a first end electrically connected to the first intermediate electrode and a second end electrically connected to the second intermediate electrode, and third light emitting elements, each of the third light emitting elements including a first end electrically connected to the second intermediate electrode and a second end electrically connected to the second pixel electrode. The second intermediate electrode may include a first portion opposing the first intermediate electrode, a second portion located between the first pixel electrode and the second pixel electrode, and a diagonal line portion located between the first portion and the second portion. The first and second portions may be located in columns that are different from each other and may have a bar shape having a uniform width in an extension direction, and the diagonal line portion may have a shape that is different from that of each of the first and second portions.

In one or more embodiments, the diagonal line portion may connect the first portion and the second portion and may extend in a direction different from the extension direction of each of the first and second portions.

In one or more embodiments, the diagonal line portion may have at least two different widths in the extension direction of the second intermediate electrode.

In one or more embodiments, at least a portion of the first intermediate electrode may surround at least one side of the first pixel electrode and may be positioned between the first pixel electrode and a second portion of the second intermediate electrode.

In one or more embodiments, the first intermediate electrode may include a first straight line portion opposing the first pixel electrode, a second straight line portion positioned between the first pixel electrode and the first portion of the second intermediate electrode, and a connection portion connecting the first straight line portion and the second straight line portion. Here, the first straight line portion and the second straight line portion may be positioned in the emission area, and the connection portion may be positioned in the non-emission area.

In one or more embodiments, the first light emitting elements may form a first series stage in which the first light emitting elements are connected in parallel between the first pixel electrode and the first intermediate electrode, the second light emitting elements may form a second series stage in which the second light emitting elements are connected in parallel between the first intermediate electrode and the first portion of the second intermediate electrode, and the third light emitting elements may form a third series stage in which the third light emitting elements are connected in parallel between the second portion of the second intermediate electrode and the second pixel electrode.

In one or more embodiments, the second light emitting elements and the third light emitting elements may be positioned to correspond to a same column in a plan view.

In one or more embodiments, the first end of each of the first, second, and third light emitting elements may include a P-type semiconductor layer, and the second end of each of the first, second, and third light emitting elements may include an N-type semiconductor layer.

In one or more embodiments, some of the first light emitting elements may be adjacent to the third light emitting elements, and rest of the first light emitting elements may be adjacent to the second light emitting elements. Here, first ends of the some of the first light emitting elements may oppose the first end of the third light emitting elements, and first ends of the rest of the first light emitting elements may oppose the first end of the second light emitting elements.

In one or more embodiments, the first end of each of the first light emitting elements, the first end of each of the second light emitting elements, and the first end of each of the third light emitting elements may be adjacent to a center of the emission area, in a plan view.

In one or more embodiments, the first pixel electrode, the first intermediate electrode, the second intermediate electrode, and the second pixel electrode may be formed by the same process and located at a same layer.

In one or more embodiments, the first pixel electrode and the second pixel electrode may be formed by different processes and provided in different layers, and the first intermediate electrode and the second intermediate electrode may be formed by different processes and located at different layers.

In one or more embodiments, the first pixel electrode and the second intermediate electrode may be provided in the same layer, and the first intermediate electrode and the second pixel electrode may be provided in the same layer.

In one or more embodiments, the pixel may further include a first alignment electrode under each of the first pixel electrode, the second straight line portion of the first intermediate electrode, and the second portion of the second intermediate electrode, and electrically connected to the first pixel electrode, a second alignment electrode under the first straight line portion of the first intermediate electrode and overlapping the first intermediate electrode, and a third alignment electrode under each of the first portion of the second intermediate electrode and the second pixel electrode, and electrically connected to the second pixel electrode.

A first alignment signal may be applied to the first alignment electrode, and a second alignment signal may be applied to the second and third alignment electrodes before the first, second, and third light emitting elements are located in the emission area. The first alignment signal and the second alignment signal may be different from each other, the first alignment signal may be an AC signal, and the second alignment signal may be a ground voltage.

In one or more embodiments, the pixel may further include a bank positioned in the non-emission area and including a first opening corresponding to the emission area and a second opening spaced from the first opening, and an insulating layer on the first alignment electrode, the second alignment electrode, and the third alignment electrode, and including a first contact portion exposing a portion of the first alignment electrode and a second contact portion exposing a portion of the third alignment electrode.

In one or more embodiments, the first contact portion and the second contact portion may be in the second opening.

In one or more embodiments, the pixel may further include a substrate, a storage capacitor on the substrate and electrically connected to the first end of each of the first light emitting elements, at least one transistor on the substrate and electrically connected to the storage capacitor, a first power line on the substrate, electrically connected to the transistor, and configured to receive a voltage of first driving power, a second power line on the substrate, electrically connected to the second end of each of the third light emitting elements, and configured to receive a voltage of second driving power, and a passivation layer on the transistor, the first power line, and the second power line and exposing each of a portion of the storage capacitor, a portion of the first power line, and a portion of the second power line.

In one or more embodiments, the pixel may further include a color conversion layer on the first and second pixel electrodes and the first and second intermediate electrodes in the emission area, and configured to convert light of a first color emitted from each of the first to third light emitting elements into light of a second color, and a color filter on the color conversion layer and configured to selectively transmit the light of the second color.

According to one or more embodiments, a display device may include a substrate including a display area and a non-display area, and a plurality of pixels in the display area and each of the plurality of pixels including an emission area and a non-emission area.

Here, each of the plurality of pixels may include a first pixel electrode and a second pixel electrode spaced from each other, a first intermediate electrode spaced from the first and second pixel electrodes and surrounding at least one side of the first pixel electrode, a second intermediate electrode spaced from the first pixel electrode, the second pixel electrode, and the first intermediate electrode, and including a first portion opposing the first intermediate electrode, a second portion located between the first pixel electrode and the second pixel electrode, and a connection portion located between the first portion and the second portion, first light emitting elements, each of the first light emitting elements including a first end electrically connected to the first pixel electrode and a second end electrically connected to the first intermediate electrode, second light emitting elements, each of the second light emitting elements including a first end

US 12,575,246 B2

5

DETAILED DESCRIPTION

Figure 1:
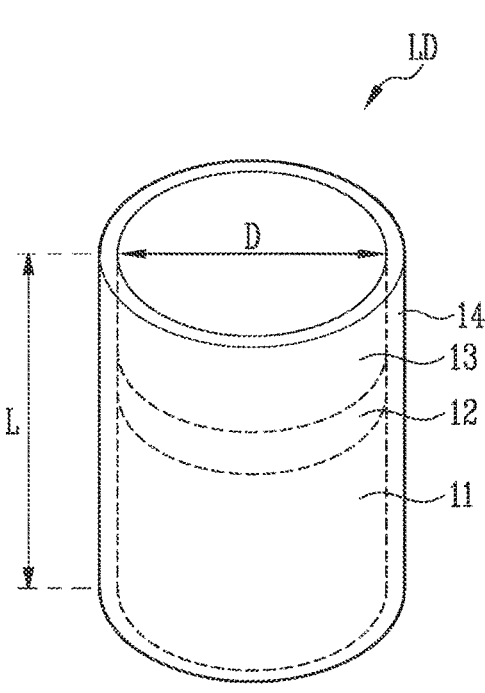

The present disclosure may be modified in various manners and have various forms. Therefore, specific embodiments will be illustrated in the drawings and will be described in detail in the specification. However, it should be understood that the present disclosure is not intended to be limited to the disclosed specific forms, and the present disclosure includes all modifications, equivalents, and substitutions within the features and technical scope of the present disclosure.

Similar reference numerals are used for similar components in describing each drawing. In the accompanying drawings, the dimensions of the structures are shown enlarged from the actual dimensions for the sake of clarity of the present disclosure. Terms of "first", "second", and the like may be used to describe various components, but the components should not be limited by the terms. The terms are used only for the purpose of distinguishing one component from another component. For example, without departing from the scope of the present disclosure, a first component may be referred to as a second component, and similarly, a second component may also be referred to as a first component.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

In the present application, in a case where "a component (for example, 'a first component') is operatively or communicatively coupled with/to or "connected to" another component (for example, 'a second component'), the case should be understood that the component may be directly connected to the other component, or may be connected to the other component through another component (for example, a 'third component'). In contrast, in a case where a component (for example, 'a first component') is "directly coupled with/to or "directly connected" to another component (for example, 'a second component'), the case may be understood that another component (for example, 'a third component') is not present between the component and the other component.

Hereinafter, embodiments of the present disclosure and others necessary for those skilled in the art to understand the present disclosure will be described in detail with reference to the accompanying drawings. In the following description, the singular expressions include plural expressions unless the context clearly dictates otherwise.

Figure 2:
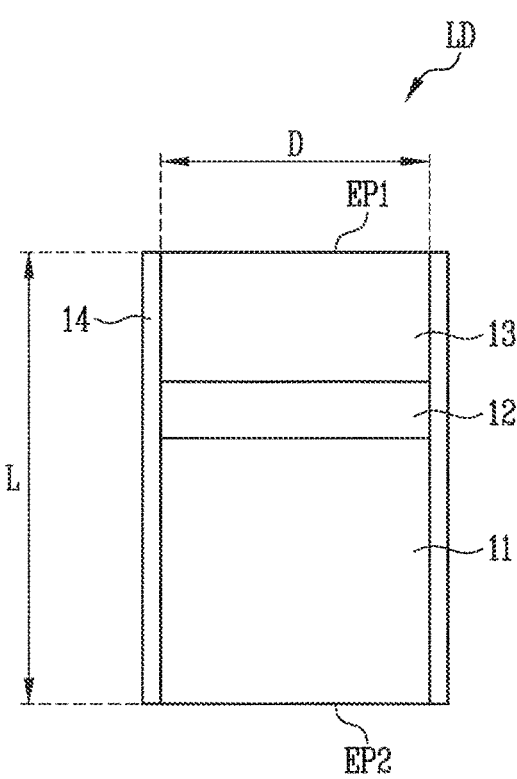

FIG. 1 is a schematic perspective view illustrating a light emitting element LD according to one or more embodiments, and FIG. 2 is a schematic cross-sectional view of the light emitting element LD of FIG. 1.

In one or more embodiments, a type and/or a shape of the light emitting element LD are not limited to the embodiments shown in FIGS. 1 and 2.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, the light emitting element LD may be implemented in a light emitting stack (or a stack pattern) in which the first semiconductor layer 11, the active layer 12, and the second semiconductor layer 13 are sequentially stacked.

The light emitting element LD may be provided in a shape extending in one direction. When an extension direction of the light emitting element LD is referred to as a length direction, the light emitting element LD may include a first end EP1 and a second end EP2 along the length direction. One semiconductor layer of the first semiconductor layer 11 and the second semiconductor layer 13 may be positioned at the first end EP1 of the light emitting element LD, and the other semiconductor layer of the first semiconductor layer 11 and the second semiconductor layer 13 may be positioned at the second end EP2 of the light emitting element LD. For example, the second semiconductor layer 13 may be positioned at the first end EP1 of the light emitting element LD, and the first semiconductor layer 11 may be disposed at the second end EP2 of the light emitting element LD.

The light emitting element LD may be provided in various shapes. For example, as shown in FIG. 1, the light emitting element LD may have a rod-like shape, a bar-like shape, or a column shape that is long in the length direction (or having an aspect ratio greater than 1). As another example, the light emitting element LD may have a rod-like shape, a bar-like shape, or a column shape that is short in the length direction (or having an aspect ratio of less than 1). As still another example, the light emitting element LD may have a rod-like shape, a bar-like shape, or a column shape having an aspect ratio of 1

The light emitting element LD may include, for example, a light emitting diode (LED) manufactured to be extremely small to have a diameter D and/or a length L of about a nano scale (or nano meter) to a micro scale (or micro meter).

When the light emitting element LD is long in the length direction (that is, the aspect ratio is greater than 1), the diameter D of the light emitting element LD may be about 0.5 μm to 6 μm, and the length L of the light emitting element LD may be about 1 μm to 10 μm. However, the diameter D and the length L of the light emitting element LD are not limited thereto. A size of the light emitting element LD may be changed to satisfy a requirement condition (or a design condition) of a lighting device or a self-emission display device to which the light emitting element LD is applied.

The first semiconductor layer 11 may include, for example, at least one N-type semiconductor layer. For example, the first semiconductor layer 11 may include any semiconductor material from among InAlGaN, GaN, AlGaN, InGaN, AlN, and InN, and may be an N-type semiconductor layer doped with a first conductive dopant (or an N-type dopant) such as silicon (Si), germanium (Ge), or tin (Sn). However, the material configuring the first semiconductor layer 11 is not limited thereto, and other various materials may configure the first semiconductor layer 11. The first semiconductor layer 11 may include an upper surface contacting the active layer 12 along the length direction of the light emitting element LD and a lower surface exposed to the outside.

The active layer 12 may be disposed on the first semiconductor layer 11 and may be formed in a single or multiple quantum well structure. For example, when the active layer 12 is formed in the multiple quantum well structure, in the active layer 12, a barrier layer, a strain reinforcing layer, and a well layer may be periodically and repeatedly stacked as one unit. The strain reinforcing layer may have a lattice constant less than that of the barrier layer to further reinforce a strain, for example, a compression strain, applied to the well layer. However, a structure of the active layer 12 is not limited to the above-described embodiment.

The active layer 12 may emit light of a wavelength of 400 nm to 900 nm, and may use a double hetero structure. In one or more embodiments, a clad layer doped with a conductive dopant may be formed on and/or under the active layer 12 along the length direction of the light emitting element LD. For example, the clad layer may be formed of an AlGaN layer or an InAlGaN layer. According to one or more embodiments, a material such as AlGaN or InAlGaN may be used to form the active layer 12, and other various materials may configure the active layer 12. The active layer 12 may include a first surface contacting the first semiconductor layer 11 and a second surface contacting the second semiconductor layer 13.

When an electric field of suitable voltage (e.g., a predetermined voltage) or more is applied between both ends of the light emitting element LD, the light emitting element LD emits light while an electron-hole pair is combined in the active layer 12. By controlling light emission of the light emitting element LD by using such a principle, the light emitting element LD may be used as a light source (or a light emitting source) of various light emitting devices including a pixel of the display device.

The second semiconductor layer 13 may be disposed on the second surface of the active layer 12 and may include a semiconductor layer of a type different from that of the first semiconductor layer 11. For example, the second semiconductor layer 13 may include at least one P-type semiconductor layer. For example, the second semiconductor layer 13 may include at least one semiconductor material from among InAlGaN, GaN, AlGaN, InGaN, AlN, and InN, and may include a P-type semiconductor layer doped with a second conductive dopant (or a P-type dopant) such as Mg, Zn, Ca, Sr, or Ba. However, the material configuring the second semiconductor layer 13 is not limited thereto, and other various materials may configure the second semiconductor layer 13. The second semiconductor layer 13 may include a lower surface contacting the second surface of the active layer 12 along the length direction of the light emitting element LD and an upper surface exposed to the outside.

In one or more embodiments, the first semiconductor layer 11 and the second semiconductor layer 13 may have thicknesses different from each other in the length direction of the light emitting element LD. For example, the first semiconductor layer 11 may have a thickness relatively thicker than that of the second semiconductor layer 13 along the length direction of the light emitting element LD. Therefore, the active layer 12 of the light emitting element LD may be positioned more adjacently to the upper surface of the second semiconductor layer 13 than to the lower surface of the first semiconductor layer 11.

Although the first semiconductor layer 11 and the second semiconductor layer 13 are shown as being configured of one layer, the present disclosure is not limited thereto. In one or more embodiments, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer for reducing a lattice constant difference. The TSBR layer may be configured of a P-type semiconductor layer such as p-GaInP, p-AlInP, and p-AlGaInP, but is not limited thereto.

According to one or more embodiments, the light emitting element LD may further include a contact electrode (hereinafter referred to as a "first contact electrode") disposed on the second semiconductor layer 13 in addition to the above-described first semiconductor layer 11, active layer 12, and second semiconductor layer 13. In addition, according to another embodiment, the light emitting element LD may further include another contact electrode (hereinafter referred to as a "second contact electrode") disposed at one end of the first semiconductor layer 11.

Each of the first and second contact electrodes may be an ohmic contact electrode, but is not limited thereto. According to one or more embodiments, the first and second contact electrodes may be Schottky contact electrodes. The first and second contact electrodes may include a conductive material. For example, the first and second contact electrodes may include an opaque metal using chromium (Cr), titanium (Ti), aluminum (Al), gold (Au), nickel (Ni), an oxide thereof, an alloy thereof, and the like alone or in combination, but are not limited thereto. According to one or more embodiments, the first and second contact electrodes may also include transparent conductive oxide such as indium tin oxide (ITO), indium zinc oxide (IZO), zinc oxide ($ZnO_x$), indium gallium zinc oxide (IGZO), and indium tin zinc oxide (ITZO). Here, the zinc oxide ($ZnO_x$) may be zinc oxide (ZnO) and/or zinc peroxide ($ZnO_2$).

The materials included in the first and second contact electrodes may be the same as or different from each other. The first and second contact electrodes may be substantially transparent or translucent. Therefore, light generated by the light emitting element LD may pass through each of the first and second contact electrodes and may be emitted to the outside of the light emitting element LD. According to one or more embodiments, when the light generated by the light emitting element LD does not pass through the first and second contact electrodes and is emitted to the outside of the light emitting element LD through an area except for the both ends of the light emitting element LD, the first and second contact electrodes may include an opaque metal.

In one or more embodiments, the light emitting element LD may further include an insulating layer 14 (or an insulating film). However, according to one or more embodiments, the insulating layer 14 may be omitted and may be provided so as to cover only a portion of the first semiconductor layer 11, the active layer 12, and the second semiconductor layer 13.

The insulating layer 14 may prevent an electrical short that may occur when the active layer 12 contacts a conductive material other than the first and second semiconductor layers 11 and 13. In addition, the insulating layer 14 may reduce or minimize a surface defect of the light emitting element LD to improve life and light emission efficiency of the light emitting element LD. In addition, when a plurality of light emitting elements LD are closely disposed, the insulating layer 14 may prevent an unwanted short that may occur between the light emitting elements LD. When the active layer 12 may prevent occurrence of a short with an external conductive material, presence or absence of the insulating layer 14 is not limited.

The insulating layer 14 may be provided in a form entirely surrounding an outer surface (e.g., an outer peripheral or circumferential surface) of the light emitting stack including the first semiconductor layer 11, the active layer 12, and the second semiconductor layer 13.

In the above-described embodiment, the insulating layer 14 entirely surround the outer surface (e.g., an outer peripheral or circumferential surface) of each of the first semiconductor layer 11, the active layer 12, and the second semiconductor layer 13, but the present disclosure is not limited thereto. According to one or more embodiments, when the light emitting element LD includes the first contact electrode, the insulating layer 14 may entirely surround an outer surface (e.g., an outer peripheral or circumferential surface) of each of the first semiconductor layer 11, the active layer 12, the second semiconductor layer 13, and the first contact electrode. In addition, according to another embodiment, the insulating layer 14 may not entirely surround the outer surface (e.g., an outer peripheral or circumferential surface) of the first contact electrode, or may surround only a portion of the outer surface (e.g., an outer peripheral or circumferential surface) of the first contact electrode and may not surround the rest of the outer surface (e.g., an outer peripheral or circumferential surface) of the first contact electrode. In addition, according to one or more embodiments, when the first contact electrode is disposed at the other end (or the upper end) of the light emitting element LD and the second contact electrode is disposed at the one end (or the lower end) of the light emitting element LD, the insulating layer 14 may expose at least one area of each of the first and second contact electrodes.

The insulating layer 14 may include a transparent insulating material. For example, the insulating layer 14 may include at least one insulating material selected from a group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide ($ZnO_x$), rucenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN), but the present disclosure is not limited thereto, and various materials having insulating properties may be used as the material of the insulating layer 14.

The insulating layer 14 may be provided in a form of a single layer, or may be provided in a form of multiple layers including double layers. For example, when the insulating layer 14 is formed of the double layers including a first insulating layer and a second insulating layer sequentially stacked, the first insulating layer and the second insulating layer may be formed of different materials (or substances), and may be formed in different processes. According to one or more embodiments, the first insulating layer and the second insulating layer may be formed by a continuous process by including the same material.

According to one or more embodiments, the light emitting element LD may be implemented with a light emitting pattern of a core-shell structure. In this case, the above-described first semiconductor layer 11 may be positioned in a core, that is, a middle (or a center) of the light emitting element LD, the active layer 12 may be provided and/or formed in a form surrounding the outer surface (e.g., an outer peripheral or circumferential surface) of the first semiconductor layer 11, and the second semiconductor layer 13 may be provided and/or formed in a form surrounding the outer surface (e.g., an outer peripheral or circumferential surface) of the active layer 12. In addition, the light emitting element LD may further include a contact electrode surrounding at least one side of the second semiconductor layer 13. In addition, according to one or more embodiments, the light emitting element LD may further include the insulating layer 14 provided on an outer surface (e.g., an outer peripheral or circumferential surface) of the light emitting pattern of the core-shell structure and including a transparent insulating material. The light emitting element LD implemented with the light emitting pattern of the core-shell structure may be manufactured by a growth method.

The above-described light emitting element LD may be used as a light emitting source (or a light source) of various display devices. The light emitting element LD may be manufactured through a surface treatment process. For example, when a plurality of light emitting elements LD are mixed in a fluid solution (or solvent) and supplied to each pixel area (for example, an emission area of each pixel or an emission area of each sub-pixel), surface treatment may be performed on each of the light emitting elements LD so that the light emitting elements LD may be uniformly sprayed without being unevenly aggregated in the solution.

A light emitting unit (or a light emitting device) including the light emitting element LD described above may be used in various types of electronic devices that require a light source, including a display device. For example, when a plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 3:
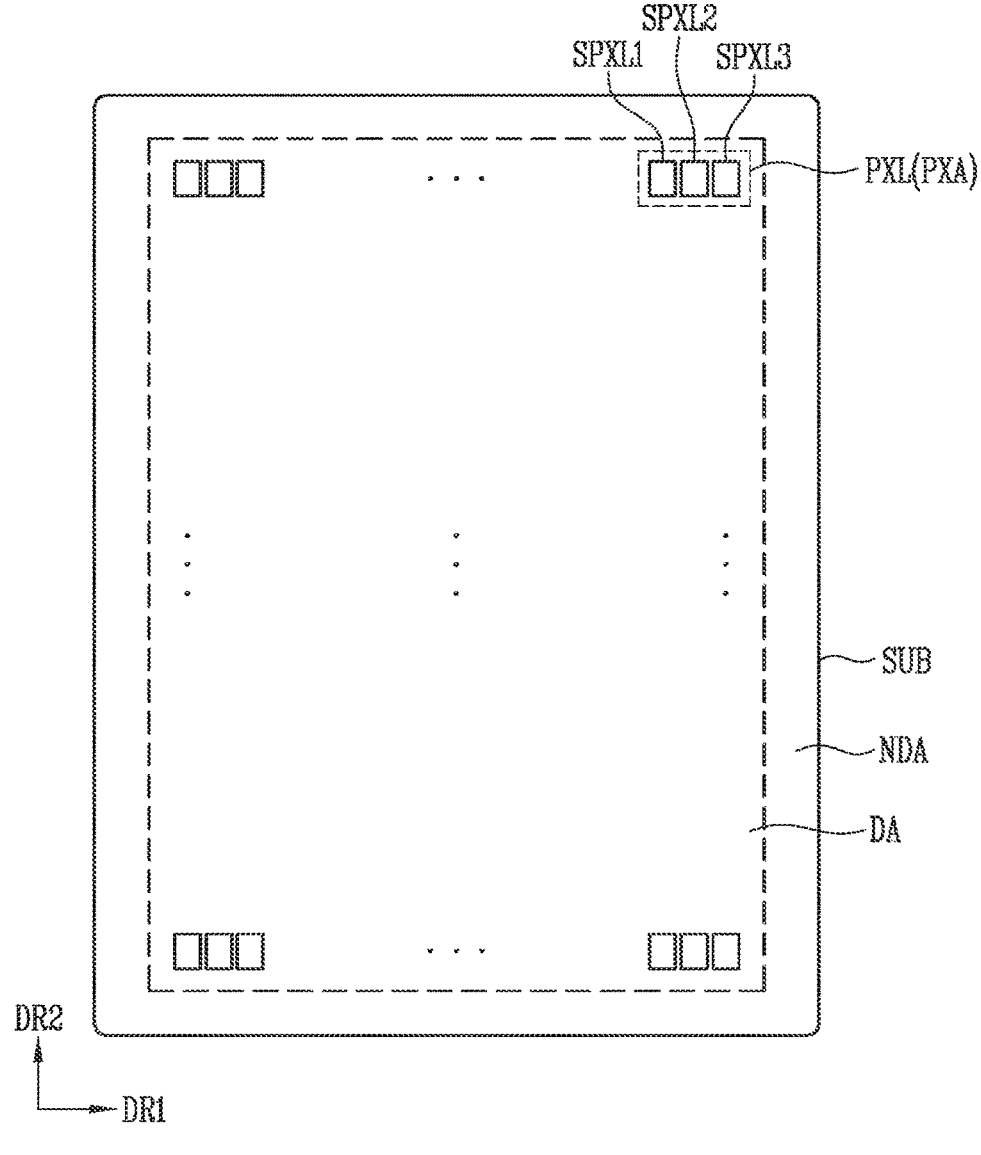

FIG. 3 is a schematic plan view illustrating a display device according to one or more embodiments.

In FIG. 3, for convenience, a structure of the display device is schematically shown centering on a display area DA where an image is displayed.

When the display device is an electronic device to which a display surface is applied to at least one surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or wearable device, the present disclosure may be applied to the display device.

Referring to FIGS. 1 to 3, the display device may include a substrate SUB, a plurality of pixels PXL provided on the substrate SUB and each including at least one light emitting element LD, a driver provided on the substrate SUB and driving the pixels PXL, and a line unit connecting the pixels PXL and the driver.

The display device may be classified into a passive matrix type display device and an active matrix type display device according to a method of driving the light emitting element LD. For example, when the display device is implemented as the active matrix type display device, each of the pixels PXL may include a driving transistor that controls a current amount supplied to the light emitting element LD, a switching transistor that transfers a data signal to the driving transistor, and the like.

The display device may be provided in various shapes, and for example, may be provided in a rectangular plate shape having two pairs of sides parallel to each other, but the present disclosure is not limited thereto. When the display device is provided in the rectangular plate shape, any one pair of sides of the two pairs of sides may be provided to be longer than the other pair of sides. For convenience, a case where the display device has a rectangular shape having a pair of long sides and a pair of short sides is disclosed. In addition, an extension direction of the long side is denoted as a second direction DR2, and an extension direction of the short side is denoted as a first direction DR1. In the display device provided in the rectangular plate shape, a corner portion in which one long side and one short side contact (or meet) may have a round shape, but is not limited thereto.

The substrate SUB may include the display area DA and a non-display area NDA.

The display area DA may be an area where the pixels PXL displaying an image are provided. The non-display area NDA may be an area in which the driver for driving the pixels PXL and a portion of the line unit connecting the pixels PXL and the driver are provided.

The non-display area NDA may be positioned adjacent to the display area DA around an edge or periphery of the display area DA. The non-display area NDA may be provided on at least one side of the display area DA. For example, the non-display area NDA may surround a periphery or circumference (or an edge) of the display area DA. The line unit connected to the pixels PXL and the driver connected to the line unit and driving the pixels PXL may be provided in the non-display area NDA.

The line unit may electrically connect the driver and the pixels PXL. The line unit may include a fan-out line connected to signal lines providing a signal to the pixel PXL and connected to each pixel PXL, for example, a scan line, a data line, an emission control line, or the like. In addition, according to one or more embodiments, the line unit may include a fan-out line connected to signal lines connected to each pixel PXL to compensate for an electrical characteristic change of each pixel PXL in real time, for example, a control line, a sensing line, or the like. Additionally, the line unit may include a fan-out line connected to power lines providing a suitable voltage (e.g., a predetermined voltage) to each pixel PXL and connected to each pixel PXL.

The substrate SUB may include a transparent insulating material and may transmit light. The substrate SUB may be a rigid substrate or a flexible substrate.

One area on the substrate SUB may be provided as the display area DA and thus the pixels PXL may be disposed. The remaining area on the substrate SUB may be provided as the non-display area NDA. For example, the substrate SUB may include the display area DA including pixel areas in which each pixel PXL is disposed, and the non-display area NDA disposed around the display area DA (or adjacent to the display area DA).

Each of the pixels PXL may be provided in the display area DA on the substrate SUB. In one or more embodiments, the pixels PXL may be arranged in the display area DA in a stripe arrangement structure, a PENTILE® arrangement structure, or the like, but the present disclosure is not limited thereto. This PENTILER arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

A first sub-pixel SPXL1, a second sub-pixel SPXL2, and a third sub-pixel SPXL3 may be provided in a pixel area PXA in which each of the pixels PXL is provided. In one or more embodiments, the first sub-pixel SPXL1 may be a red pixel (or a red sub-pixel), the second sub-pixel SPXL2 may be a green pixel (or a green sub-pixel), and the third sub-pixel SPXL3 may be a blue pixel (or a blue sub-pixel). However, the present disclosure is not limited thereto, and according to one or more embodiments, the second sub-pixel SPXL2 may be a red pixel, the first sub-pixel SPXL1 may be a green pixel, and the third sub-pixel SPXL3 may be a blue pixel. In addition, according to another embodiment, the third sub-pixel SPXL3 may be a red pixel, the first sub-pixel SPXL1 may be a green pixel, and the second sub-pixel SPXL2 may be a blue pixel.

The first sub-pixel SPXL1 may include a first pixel circuit and a first light emitting unit, the second sub-pixel SPXL2 may include a second pixel circuit and a second light emitting unit, and the third sub-pixel SPXL3 may include a third pixel circuit and a third light emitting unit.

The first, second, and third pixel circuits and the first, second, and third light emitting units may be disposed in different layers and may overlap each other. For example, the first, second, and third pixel circuits may be disposed in a pixel circuit layer (for example, refer to "PCL" of FIGS. 5A, 5B, and 6) of a sub-pixel area in which each sub-pixel is disposed. In addition, the first, second, and third light emitting units may be disposed in a display element layer (for example, refer to "DPL" of FIGS. 6 to 13) overlapping the pixel circuit layer PCL in a corresponding sub-pixel.

A first alignment electrode, a second alignment electrode, and a third alignment electrode that are spaced from each other may be disposed in the first, second, and third light emitting units. The light emitting element LD may be disposed between two adjacent alignment electrodes from among the first, second, and third alignment electrodes. Configurations disposed in the pixel area PXA are described later with reference to FIGS. 5A to 16.

Each pixel PXL may include at least one light emitting element LD driven by corresponding scan signal and data signal. The light emitting element LD may have a size as small as a nano scale (or nano meter) to a micro scale (or micro meter) and may be connected in parallel with adjacently disposed light emitting elements, but the present disclosure is not limited thereto. The light emitting element LD may configure a light source of each pixel PXL.

Each pixel PXL may include at least one light source driven by a suitable signal (e.g., a predetermined signal, for example, a scan signal, a data signal, and the like) and/or a suitable power (e.g., a predetermined power, for example, first driving power, second driving power, and the like), for example, the light emitting element LD shown in FIGS. 1 and 2. However, in one or more embodiments, the type of the light emitting element LD that may be used as the light source of each pixel PXL is not limited thereto.

The driver may supply a suitable signal and a suitable power (e.g., a predetermined signal and a predetermined power) to each pixel PXL through the line unit, and thus may control driving of the pixel PXL.

Figure 4:
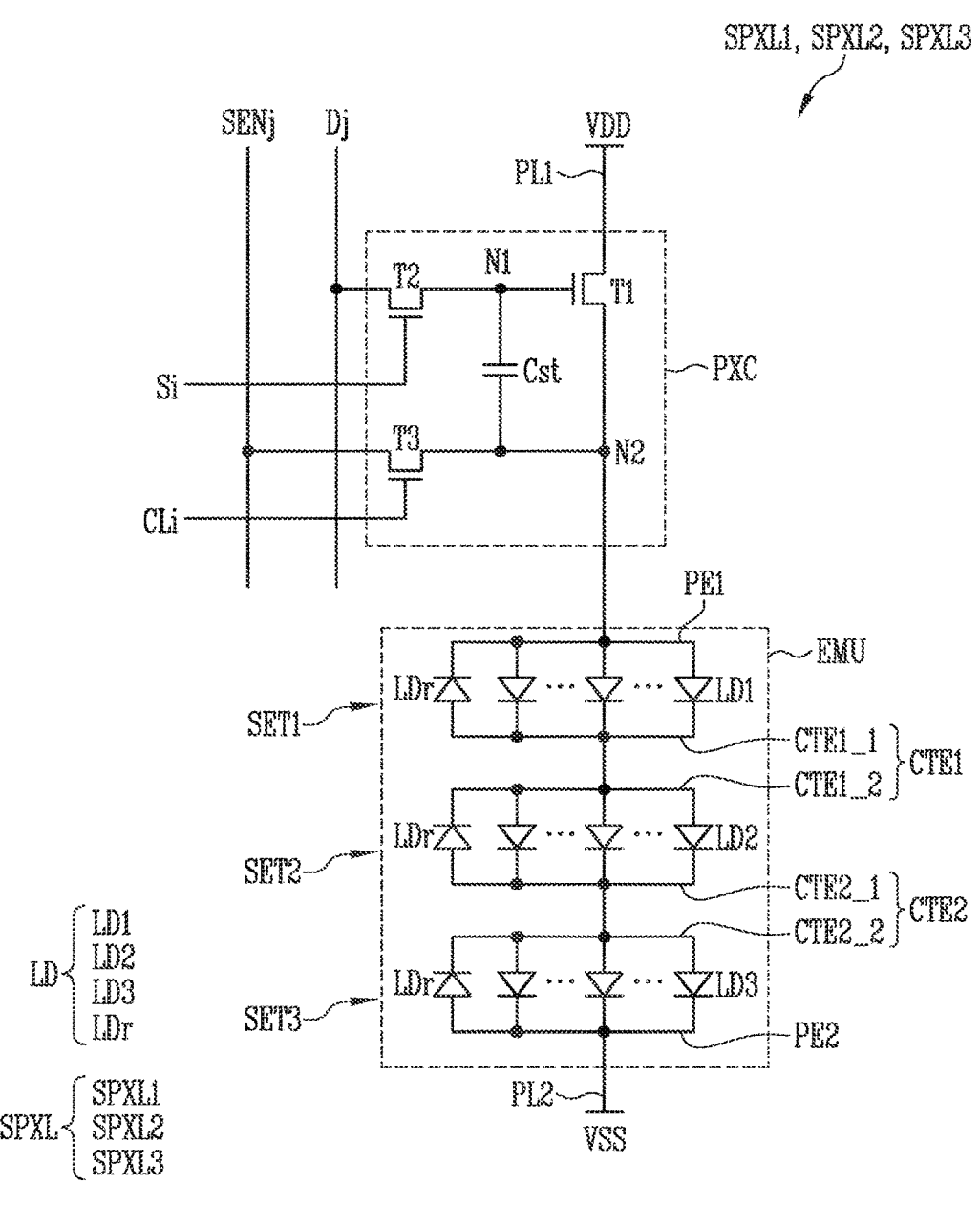

FIG. 4 is a schematic circuit diagram illustrating an electrical connection relationship between components included in each of the first to third sub-pixels SPXL1, SPXL2, and SPXL3 shown in FIG. 3 according to one or more embodiments.

For example, FIG. 4 shows the electrical connection relationship between the components included in each of the first to third sub-pixels SPXL1, SPXL2, and SPXL3 applicable to an active matrix type display device according to one or more embodiments. However, types of the components included in each of the first to third sub-pixels SPXL1, SPXL2, and SPXL3 to which an embodiment applicable are not limited thereto. In the following embodiment, the first sub-pixel SPXL1, the second sub-pixel SPXL2, and the third sub-pixel SPXL3 are collectively referred to as the sub-pixel SPXL or the sub-pixels SPXL.

Referring to FIGS. 1 to 4, the sub-pixel SPXL may include a light emitting unit EMU (or an emission unit) that generates light of a luminance corresponding to a data signal. In addition, the sub-pixel SPXL may selectively further include a pixel circuit PXC for driving the light emitting unit EMU.

According to one or more embodiments, the light emitting unit EMU may include a plurality of light emitting elements LD connected in parallel between a first power line PL1 connected to first driving power VDD to which a voltage of the first driving power VDD is applied and a second power line PL2 connected to second driving power VSS to which a voltage of the second driving power VSS is applied. For example, the light emitting unit EMU may include a first pixel electrode PE1 connected to the first driving power VDD through the pixel circuit PXC and the first power line PL1, a second pixel electrode PE2 connected to the second driving power VSS through the second power line PL2, and the plurality of light emitting elements LD connected in parallel in the same direction between the first and second pixel electrodes PE1 and PE2. In one or more embodiments, the first pixel electrode PE1 may be an anode, and the second pixel electrode PE2 may be a cathode.

Each of the light emitting elements LD included in the light emitting unit EMU may include one end (or a first end) connected to the first driving power VDD through the first pixel electrode PE1 and another end (or a second end) connected to the second driving power VSS through the second pixel electrode PE2. The first driving power VDD and the second driving power VSS may have different potentials. For example, the first driving power VDD may be set as high potential power, and the second driving power VSS may be set as low potential power. At this time, a potential difference between the first driving power VDD and the second driving power VSS may be set as a threshold voltage or more of the light emitting elements LD during an emission period of the sub-pixel SPXL.

As described above, the respective light emitting elements LD connected in parallel in the same direction (for example, a forward direction) between the first pixel electrode PE1 and the second pixel electrode PE2 to which the voltages of the different power are supplied may configure respective effective light sources.

The light emitting elements LD of the light emitting unit EMU may emit light with a luminance corresponding to a driving current supplied through a corresponding pixel circuit PXC. For example, a driving current corresponding to a grayscale value of corresponding frame data of the pixel circuit PXC may be supplied to the light emitting unit EMU during each frame period. The driving current supplied to the light emitting unit EMU may be divided and flow to each of the light emitting elements LD. Therefore, each of the light emitting elements LD may emit light with a luminance corresponding to the current flowing through the light emitting element LD, and thus the light emitting unit EMU may emit light of the luminance corresponding to the driving current.

In the above-described embodiment, an embodiment in which the both ends of the light emitting elements LD are connected in the same direction between the first and second driving power VDD and VSS is described, but the present disclosure is not limited thereto. According to one or more embodiments, the light emitting unit EMU may further include at least one ineffective light source, for example, a reverse light emitting element LDr, in addition to the light emitting elements LD configuring each effective light source. The reverse light emitting element LDr may be connected in parallel between the first and second pixel electrodes PE1 and PE2 together with the light emitting elements LD configuring the effective light sources, and may be connected between the first and second pixel electrodes PE1 and PE2 in a direction opposite to the light emitting elements LD. The reverse light emitting element LDr maintains an inactive state even though a driving voltage (e.g., a predetermined driving voltage, for example, a driving voltage of a forward direction) is applied between the first and second pixel electrodes PE1 and PE2, and thus a current substantially does not flow through the reverse light emitting element LDr.

The pixel circuit PXC may be connected to a scan line Si and a data line Dj of the sub-pixel SPXL. In addition, the pixel circuit PXC may be connected to a control line CLi and a sensing line SENj of the sub-pixel SPXL. For example, when the sub-pixel SPXL is disposed in an i-th row and a j-th column of the display area DA, the pixel circuit PXC of the sub-pixel SPXL may be connected to the i-th scan line Si and the j-th data line Dj, the i-th control line CLi, and the j-th sensing line SENj of the display area DA.

The pixel circuit PXC may include first to third transistors T1 to T3 and a storage capacitor Cst.

The first transistor T1 may be a driving transistor for controlling the driving current applied to the light emitting unit EMU, and may be connected between the first driving power VDD and the light emitting unit EMU. For example, a first terminal of the first transistor T1 may be connected (or coupled) to the first driving power VDD through the first power line PL1, a second terminal of the first transistor T1 may be connected to a second node N2, and a gate electrode of the first transistor T1 may be connected to a first node N1. The first transistor T1 may control an amount of the driving current applied from the first driving power VDD to the light emitting unit EMU through the second node N2, according to a voltage applied to the first node N1. In one or more embodiments, the first terminal of the first transistor T1 may be a drain electrode, and the second terminal of the first transistor T1 may be a source electrode, but the present disclosure is not limited thereto. According to one or more embodiments, the first terminal may be a source electrode and the second terminal may be a drain electrode.

The second transistor T2 may be a switching transistor that selects the sub-pixel SPXL in response to a scan signal and activates the sub-pixel SPXL, and may be connected between the data line Dj and the first node N1. A first terminal of the second transistor T2 may be connected to the data line Dj, a second terminal of the second transistor T2 may be connected to the first node N1, and a gate electrode of the second transistor T2 may be connected to the scan line Si. The first terminal and the second terminal of the second transistor T2 may be different terminals. For example, when the first terminal is a drain electrode, the second terminal may be a source electrode.

The second transistor T2 may be turned on when a scan signal of a gate-on voltage (for example, a high level voltage) is supplied from the scan line Si, to electrically connect the data line Dj and the first node N1. The first node N1 may be a point where the second terminal of the second transistor T2 and the gate electrode of the first transistor T1 are connected, and the second transistor T2 may transmit a data signal to the gate electrode of the first transistor T1.

The third transistor T3 may connect the first transistor T1 to the sensing line SENj to obtain a sensing signal through the sensing line SENj, and detect a characteristic of the sub-pixel SPXL including a threshold voltage and the like of the first transistor T1 using the sensing signal. Information on the characteristic of the sub-pixel SPXL may be used to convert image data so that a characteristic deviation between the sub-pixels SPXL may be compensated. A second terminal of the third transistor T3 may be connected to the second terminal of the first transistor T1, a first terminal of the third transistor T3 may be connected to the sensing line SENj, and a gate electrode of the third transistor T3 may be connected to the control line CLi. In addition, the first terminal of the third transistor T3 may be connected to initialization power. The third transistor T3 may be an initialization transistor capable of initializing the second node N2, and may be turned on when a control signal (or a sensing control signal) is supplied from the control line CLi, to transmit a voltage of the initialization power to the second node N2. Accordingly, a second storage electrode of the storage capacitor Cst connected to the second node N2 may be initialized.

A first storage electrode (or a lower electrode) of the storage capacitor Cst may be connected to the first node N1, and a second storage electrode (or an upper electrode) of the storage capacitor Cst may be connected to the second node N2. The storage capacitor Cst charges a data voltage corresponding to the data signal supplied to the first node N1 during one frame period. Accordingly, the storage capacitor Cst may store a voltage corresponding to a voltage difference between a voltage of the gate electrode of the first transistor T1 and a voltage of the second node N2.

The light emitting unit EMU may be configured to include at least one series stage including the plurality of light emitting elements LD connected in parallel with each other. For example, the light emitting unit EMU may be configured in a series/parallel mixed structure as shown in FIG. 4. In one or more embodiments, the light emitting unit EMU may be configured to include a first series stage SET1, a second series stage SET2, and a third series stage SET3.

The light emitting unit EMU may include first to third series stages SET1, SET2, and SET3 sequentially connected between the first and second driving power VDD and VSS.

Each of the first to third series stages SET1, SET2, and SET3 may include two electrodes PE1 and CTE1_1, CTE1_2 and CTE2_1, and CTE2_2 and PE2 configuring an electrode pair of a corresponding series stage, and the plurality of light emitting elements LD connected in parallel in the same direction between the two electrodes PE1 and CTE1_1, CTE1_2 and CTE2_1, and CTE2_2 and PE2.

The first series stage SET1 may include the first pixel electrode PE1, the (1-1)-th intermediate electrode CTE1_1, and at least one first light emitting element LD1 connected between the first pixel electrode PE1 and the (1-1)-th intermediate electrode CTE1_1. In addition, the first series stage SET1 may include the reverse light emitting element LDr connected in a direction opposite to the first light emitting element LD1 between the first pixel electrode PE1 and the (1-1)-th intermediate electrode CTE1_1.

The second series stage SET2 may include the (1_2)-th intermediate electrode CTE1_2 and the (2_1)-th intermediate electrode CTE2_1, and at least one second light emitting element LD2 connected between the (1_2)-th intermediate electrode CTE1_2 and the (2_1)-th intermediate electrode CTE2_1. In addition, the second series stage SET2 may include the reverse light emitting element LDr connected in a direction opposite to the second light emitting element LD2 between the (1_2)-th intermediate electrode CTE1_2 and the (2_1)-th intermediate electrode CTE2_1.

The (1_1)-th intermediate electrode CTE1_1 of the first series stage SET1 and the (1_2)-th intermediate electrode CTE1_2 of the second series stage SET2 may be integrally provided and connected to each other. That is, the (1_1)-th intermediate electrode CTE1_1 and the (1_2)-th intermediate electrode CTE1_2 may configure a first intermediate electrode CTE1 electrically connecting the successive first series stage SET1 and second series stage SET2. When the (1_1)-th intermediate electrode CTE1_1 and the (1_2)-th intermediate electrode CTE1_2 are integrally provided, the (1_1)-th intermediate electrode CTE1_1 and the (1_2)-th intermediate electrode CTE1_2 may be different areas of the first intermediate electrode CTE1.

The third series stage SET3 may include the (2-2)-th second intermediate electrode CTE2_2 and the second pixel electrode PE2, at least one third light emitting element LD3 connected between the (2-2)-th second intermediate electrode CTE2_2 and the second pixel electrode PE2. In addition, the third series stage SET3 may include the reverse light emitting element LDr connected in a direction opposite to the third light emitting element LD3 between the (2-2)-th second intermediate electrode CTE2_2 and the second pixel electrode PE2.

The (2_1)-th intermediate electrode CTE2_1 of the second series stage SET2 and the (2_2)-th intermediate electrode CTE2_2 of the third series stage SET3 may be integrally provided and connected to each other. That is, the (2_1)-th intermediate electrode CTE2_1 and the (2_2)-th intermediate electrode CTE2_2 may configure a second intermediate electrode CTE2 electrically connecting the successive second series stage SET2 and third series stage SET3. When the (2_1)-th intermediate electrode CTE2_1 and the (2_2)-th intermediate electrode CTE2_2 are integrally provided, the (2_1)-th intermediate electrode CTE2_1 and the (2_2)-th intermediate electrode CTE2_2 may be different areas of the second intermediate electrode CTE2.

In the above-described embodiment, the first pixel electrode PE1 of the first series stage SET1 may be an anode of the light emitting unit EMU, and the second pixel electrode PE2 of the third series stage SET3 may be a cathode of the light emitting unit EMU.

As described above, the light emitting unit EMU of the sub-pixel SPXL including the series stages SET1, SET2, and SET3 (or the light emitting elements LD) connected in a series/parallel mixed structure may easily adjust a driving current/voltage condition according to an applied product specification.

For example, the light emitting unit EMU of the sub-pixel SPXL including the series stages SET1, SET2, and SET3 (or the light emitting elements LD) connected in the series/parallel mixed structure may reduce a driving current compared to the light emitting unit of a structure in which the light emitting elements LD are connected only in parallel. In addition, the light emitting unit EMU of the sub-pixel SPXL including the series stages SET1, SET2, and SET3 connected in the series/parallel mixed structure may reduce a driving voltage applied to both ends of the light emitting unit EMU compared to the light emitting unit in which all of the same number of light emitting elements LD are connected in series. Furthermore, the light emitting unit EMU of the sub-pixel SPXL including the series stages SET1, SET2, and SET3 or the light emitting elements LD connected in the series/parallel mixed structure may include a greater number of light emitting elements LD between the same number of electrodes PE1, CTE1_1, CTE1_2, CTE2_1, CTE2_2, and PE2 compared to the light emitting unit of a structure in which all of the series stages are connected in series. In this case, light output efficiency of the light emitting elements LD may be improved, and even though a defect occurs in a specific series stage, a ratio of the light emitting elements LD that do not emit light due to the defect may be relatively reduced, and thus a reduction of the light emission efficiency of the light emitting elements LD may be alleviated.

Figure 5A:
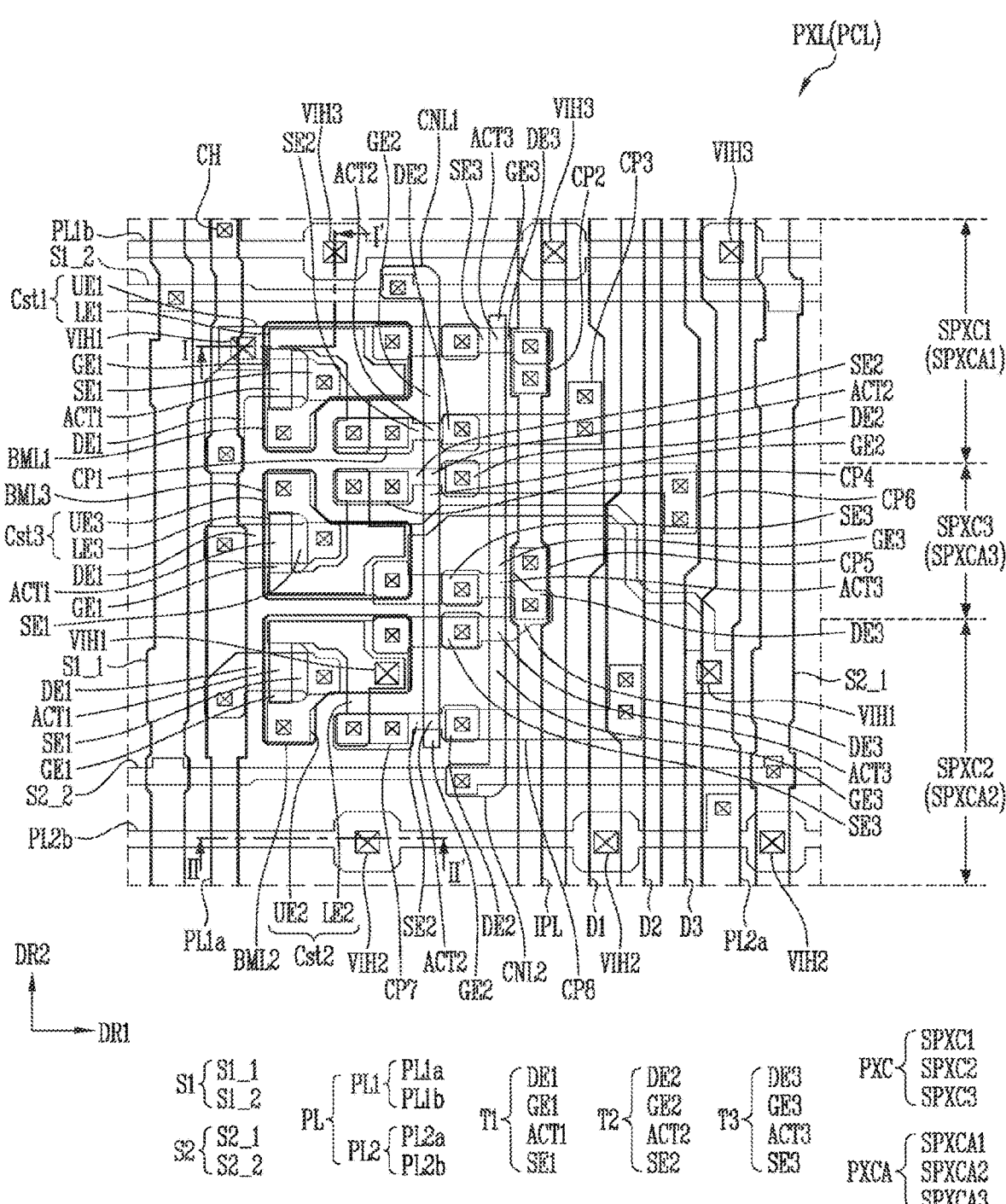
Figure 5B:
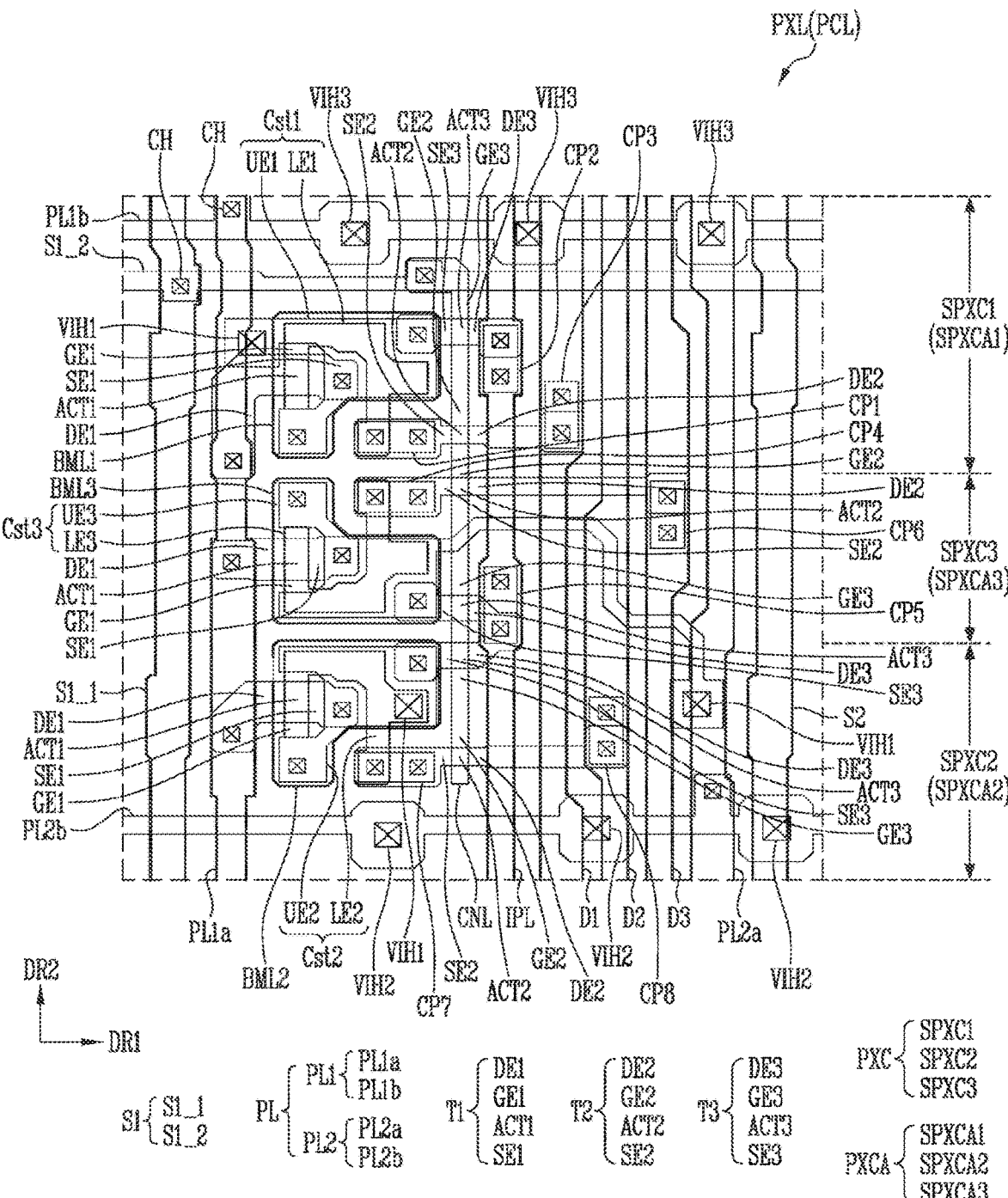
Figure 6:
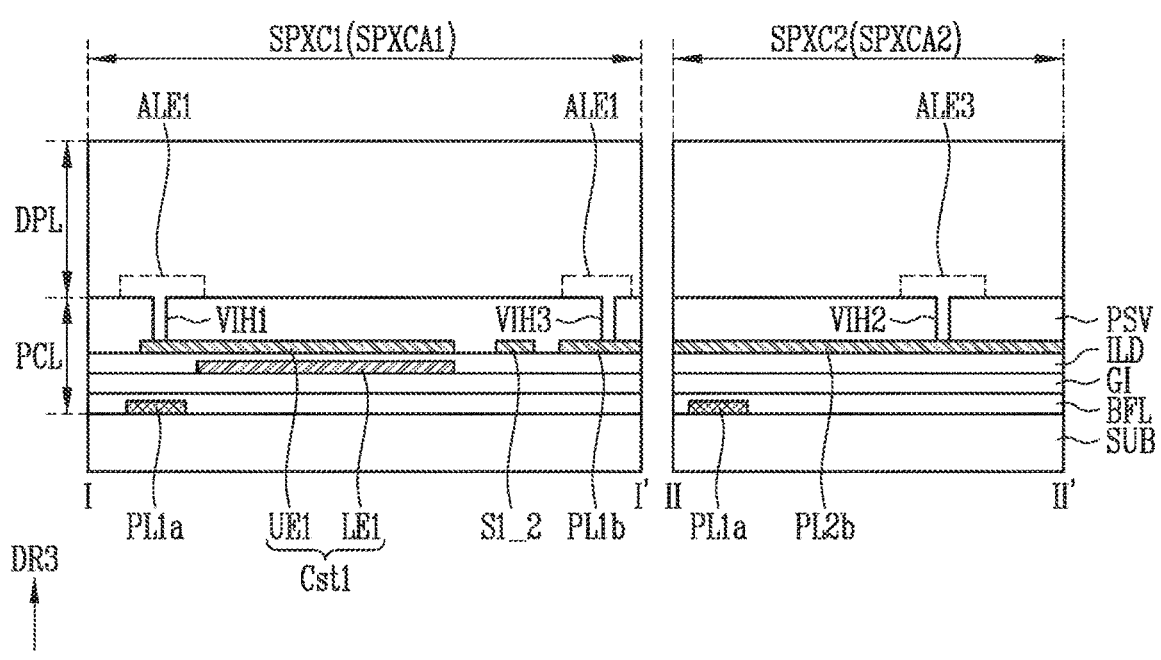

FIGS. 5A and 5B are schematic plan views illustrating the pixel circuit layer PCL of the pixel PXL shown in FIG. 3, and FIG. 6 is a schematic cross-sectional view taken along the line I-I' and the line II-II' of FIG. 5A.

For example, FIG. 5A schematically shows an embodiment of a structure of the pixel circuit layer PCL based on the pixel area PXA in which the pixel PXL of FIG. 3 is disposed.

For reference, the embodiments of FIGS. 5A and 5B disclose different embodiments in relation to an electrical connection relationship or the like of the scan line and the second and third transistors T2 and T3. For example, FIG. 5A discloses an embodiment in which the second transistor T2 and the third transistor T3 are electrically connected to different scan lines, and FIG. 5B discloses an embodiment in which the second and third transistors T2 and T3 are electrically connected to the same scan line.

In FIGS. 5A and 5B, for convenience of description, a horizontal direction on a plane is indicated as a first direction DR1 and a vertical direction on the plane is indicated as a second direction DR2.

In FIG. 6, the pixel circuit layer PCL of the pixel PXL is simplified, such as showing each electrode as a single layer electrode and each insulating layer as only a single layer insulating layer, but the present disclosure is not limited thereto. In FIG. 6, a vertical direction (or a thickness direction of the substrate SUB) on a cross-section is indicated as a third direction DR3.

In the following embodiment, not only components included in the pixel PXL shown in FIGS. 5A, 5B, and 6, but also an area in which the components are provided (or positioned) are collectively referred to as the pixel PXL.

Referring to FIGS. 1 to 6, the pixel circuit layer PCL of the pixel PXL may include a plurality of pixel circuits PXC disposed in the pixel area PXA. For example, the pixel circuit layer PCL may include a first pixel circuit SPXC1 disposed in a first circuit area SPXCA1 of the pixel area PXA, a second pixel circuit SPXC2 disposed in a second circuit area SPXCA2, and a third pixel circuit SPXC3 disposed in a third circuit area SPXCA3.

For example, the pixel area PXA may be partitioned in an order of the first circuit area SPXCA1, the third circuit area SPXCA3, and the second circuit area SPXCA2 along the second direction DR2.

The pixel circuit layer PCL may include at least one insulating layer disposed on the substrate SUB. For example, the pixel circuit layer PCL may include a buffer layer BFL, a gate insulating layer GI, an interlayer insulating layer ILD, and a passivation layer PSV sequentially stacked on the substrate SUB along the third direction DR3.

The buffer layer BFL may be entirely disposed on the substrate SUB. The buffer layer BFL may prevent an impurity from diffusing into the transistors T1, T2, and T3 included in the first to third pixel circuits SPXC1, SPXC2, and SPXC3. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and aluminum oxide ($AlO_x$). The buffer layer BFL may be provided as a single layer, but may also be provided as multiple layers of at least double layers. When the buffer layer BFL is provided as the multiple layers, each layer may be formed of the same material or may be formed of different materials. The buffer layer BFL may be omitted according to a material, a process condition, and the like of the substrate SUB.

The gate insulating layer GI may be entirely disposed on the buffer layer BFL. The gate insulating layer GI may include the same material as the above-described buffer layer BFL or may include a material suitable from the materials exemplified as the configuration material of the buffer layer BFL. For example, the gate insulating layer GI may be an inorganic insulating layer including an inorganic material.

The interlayer insulating layer ILD may be entirely provided and/or formed on the gate insulating layer GI. The interlayer insulating layer ILD may include the same material as the gate insulating layer GI, or may include one or more materials selected from the materials exemplified as the configuration material of the gate insulating layer GI.

The passivation layer PSV may be entirely provided and/or formed on the interlayer insulating layer ILD. The passivation layer PSV may be an inorganic layer (or an inorganic insulating layer) including an inorganic material or an organic layer (or an organic insulating layer) including an organic material. The inorganic layer may include, for example, at least one of silicon oxide ($SiO_x$), silicon nitride ($SiN_x$), silicon oxynitride ($SiO_xN_y$), and aluminum oxide ($AlO_x$). The organic layer may include, for example, at least one of an acrylic resin (polyacrylates resin), an epoxy resin, a phenolic resin, a polyamide resin, a polyimide resin, an unsaturated polyester resin, a poly-phenylene ethers resin, a poly-phenylene sulfides resin, and a benzocyclobutene resin.

The passivation layer PSV may be partially opened to expose some configurations of each of the first to third pixel circuits SPXC1, SPXC2, and SPXC3. For example, the passivation layer PSV may be partially opened to include a first via hole VIH1 (a "first through hole", or a "first contact hole") exposing each of a first upper electrode UE1 of the first pixel circuit SPXC1, a second upper electrode UE2 of the second pixel circuit SPXC2, and a third upper electrode UE3 of the third pixel circuit SPXC3. The passivation layer PSV may be partially opened to include three second via holes VIH2 exposing one area of a second horizontal power line PL2b of the pixel circuit layer PCL. In addition, the passivation layer PSV may be partially opened to include three third via holes VIH3 exposing one area of a first horizontal power line PL1b of the pixel circuit layer PCL.

The pixel circuit layer PCL may include at least one conductive layer disposed between the above-described insulating layers. For example, the pixel circuit layer PCL may include a first conductive layer disposed between the substrate SUB and the buffer layer BFL, a second conductive layer disposed on the gate insulating layer GI, and a third conductive layer disposed on the interlayer insulating layer ILD.

The first conductive layer may be formed in a single layer formed of a group consisting of copper (Cu), molybdenum (Mo), tungsten (W), aluminum neodymium (AlNd), titanium (Ti), aluminum (Al), silver (Ag), and an alloy thereof alone or a mixture thereof, or may be formed in a double layer or multiple layer structure of molybdenum (Mo), titanium (Ti), copper (Cu), aluminum (Al), or silver (Ag), which is a low-resistance material to reduce a line resistance. Each of the second and third conductive layers may include the same material as the first conductive layer or may include one or more materials suitable from the material exemplified as the configuration material of the first conductive layer, but is not limited thereto.

In one or more embodiments, the substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may further include a plurality of contact holes CH for connecting circuit elements, electrodes, and/or lines (e.g., predetermined circuit elements, electrodes, and/or lines) disposed in the pixel circuit layer PCL on the substrate SUB to each other. For convenience, in FIGS. 5A and 5B, only one contact hole CH is denoted by a symbol representing the contact holes CH for connecting specific elements in the pixel circuit layer PCL.

The pixel circuit layer PCL may further include lines disposed on the substrate SUB and electrically connected to the pixels PXL. For example, the pixel circuit layer PCL may include a scan line, data lines D1, D2, and D3, power lines PL, and an initialization power line IPL.

In the embodiment of FIG. 5A, the scan line may include a first scan line S1 and a second scan line S2 that are disposed to be spaced from each other.

The first scan line S1 may include a first horizontal scan line S1_2 extending in the first direction DR1 and a first vertical scan line S1_1 extending in the second direction DR2 crossing the first direction DR1. A scan signal may be applied to the first scan line S1.

The first vertical scan line S1_1 and the first horizontal scan line S1_2 may be disposed in different layers and may be electrically connected through a corresponding contact hole CH. For example, the first horizontal scan line S1_2 may be configured as a single layer including the third conductive layer, the first vertical scan line S1_1 may be configured as a single layer including the first conductive layer, and the first horizontal scan line S1_2 and the first vertical scan line S1_1 may be connected to each other through the corresponding contact hole CH. According to one or more embodiments, each of the first horizontal scan line S1_2 and the first vertical scan line S1_1 may be configured as multiple layers in which at least two or more conductive layers from among the first, second, and third conductive layers are stacked.

The first horizontal scan line S1_2 may be electrically connected to a first connection line CNL1 through a corresponding contact hole CH.

The first connection line CNL1 may be provided integrally with a second gate electrode GE2 of the second transistor T2 of each of the first to third pixel circuits SPXC1, SPXC2, and SPXC3. The first connection line CNL1 may be, for example, the second conductive layer.

The second scan line S2 may include a second horizontal scan line S2_2 extending in the first direction and a second vertical scan line S2_1 extending in the second direction DR2. A control signal (or a sensing control signal) may be applied to the second scan line S2.

The second horizontal scan line S2_2 and the second vertical scan line S2_1 may be disposed in different layers and may be electrically connected through a corresponding contact hole CH. For example, the second horizontal scan line S2_2 may be configured as a single layer including the third conductive layer, the second vertical scan line S2_1 may be configured as a single layer including the first conductive layer, and the second horizontal scan line S2_2 and the second vertical scan line S2_1 may be connected to each other through the corresponding contact hole CH.

The second horizontal scan line S2_2 may be electrically connected to a second connection line CNL2 through a corresponding contact hole CH.

The second connection line CNL2 may be provided integrally with a third gate electrode GE3 of the third transistor T3 of each of the first to third pixel circuits SPXC1, SPXC2, and SPXC3. The second connection line CNL2 may be the second conductive layer.

In the pixel PXL according to the embodiment of FIG. 5B, the first scan line S1 including the first vertical scan line S1_1 and the first horizontal scan line S1_2 may be disposed. The first vertical scan line S1_1 and the first horizontal scan line S1_2 may be disposed in different layers and may be electrically connected through the corresponding contact hole CH. The first vertical scan line S1_1 may be configured as a single layer including the first conductive layer, and the first horizontal scan line S1_2 may be configured as a single layer including the third conductive layer. The scan signal or the control signal may be supplied to the first vertical scan line S1_1 according to a set period. The first horizontal scan line S1_2 may be electrically connected to a connection line CNL through a corresponding contact hole CH. The connection line CNL may be provided integrally with the second gate electrode GE2 of the second transistor T2 of each of the first to third pixel circuits SPXC1, SPXC2, and SPXC3 and the third gate electrode GE3 of the third transistor T3 of a corresponding pixel circuit. The connection line CNL may be configured of the second conductive layer. The connection line CNL may supply the scan signal transmitted from the first horizontal scan line S1_2 through the corresponding contact hole CH to the second gate electrode GE2 of the second transistor T2 of each of the first to third pixel circuits SPXC1, SPXC2, and SPXC3. In addition, the connection line CNL may supply the control signal transmitted from the first horizontal scan line S1_2 through the corresponding contact hole CH to the third gate electrode GE3 of the third transistor T3 of each of the first to third pixel circuits SPXC1, SPXC2, and SPXC3.

The data lines D1, D2, and D3 may include a first data line D1, a second data line D2, and a third data line D3 disposed to be spaced from each other along the first direction DR1 and extending in the second direction DR2. A corresponding data signal may be applied to each of the first, second, and third data lines D1, D2, and D3. The first, second, and third data lines D1, D2, and D3 may be the first conductive layer.

The first data line D1 may be electrically connected to the second transistor T2 of the first pixel circuit SPXC1, the second data line D2 may be electrically connected to the second transistor T2 of the second pixel circuit SPXC2, and the third data line D3 may be electrically connected to the third transistor T3 of the third pixel circuit SPXC3.

The power line PL may include the first power line PL1 and the second power line PL2 disposed to be spaced from each other.

The first power line PL1 may include a first vertical power line PL1a extending in the second direction DR2 and a first horizontal power line PL1b extending in the first direction DR1. The voltage of the first driving power VDD may be applied to the first power line PL1.

The first vertical power line PL1a and the first horizontal power line PL1b may be disposed in different layers and may be electrically connected through a corresponding contact hole CH. For example, the first vertical power line PL1a may be the first conductive layer, and the first horizontal power line PL1b may be the third conductive layer. The first power line PL1 may have a mesh structure by the first vertical power line PL1a and the first horizontal power line PL1b connected to each other.

The second power line PL2 may include a second vertical power line PL2a extending in the second direction DR2 and a second horizontal power line PL2b extending in the first direction DR1. The voltage of the second driving power VSS may be applied to the second power line PL2.

The second vertical power line PL2a and the second horizontal power line PL2b may be disposed in different layers and may be electrically connected through a corresponding contact hole CH. For example, the second vertical power line PL2a may be the first conductive layer, and the second horizontal power line PL2b may be the third conductive layer. The second power line PL2 may have a mesh structure by the second vertical power line PL2a and the second horizontal power line PL2b connected to each other.

The initialization power line IPL may extend in the second direction DR2, and a voltage of the initialization power may be applied to the initialization power line IPL. The initialization power line IPL may be the first conductive layer. The initialization power line IPL may be electrically connected to the third transistor T3 of the first pixel circuit SPXC1 through a second conductive pattern CP2, and may be electrically connected to the third transistor T3 of each of the second and third pixel circuits SPXC2 and SPXC3 through a fifth conductive pattern CP5.

The second conductive pattern CP2 may be the third conductive layer, and may electrically connect the initialization power line IPL and the third transistor T3 of the first pixel circuit SPXC1 through a corresponding contact hole CH.

The fifth conductive pattern CP5 may be the third conductive layer, and may electrically connect the initialization power line IPL and the third transistor T3 of each of the second and third pixel circuits SPXC2 and SPXC3 through a corresponding contact hole CH.

Each of the first, second, and third pixel circuits SPXC1, SPXC2, and SPXC3 may include the first transistor T1, the second transistor T2, the third transistor T3, and a storage capacitor. For example, the first pixel circuit SPXC1 may include the first to third transistors T1 to T3 and a first storage capacitor Cst1, the second pixel circuit SPXC2 may include the first to third transistors T1 to T3 and a second storage capacitor Cst2, and the third pixel circuit SPXC3 may include the first to third transistors T1 to T3 and a third storage capacitor Cst3.

The first pixel circuit SPXC1, the second pixel circuit SPXC2, and the third pixel circuit SPXC3 may have substantially similar or identical structures. Hereinafter, the first pixel circuit SPXC1 from among the first to third pixel circuits SPXC1, SPXC2, and SPXC3 is described as a representative, and the second and third pixel circuits SPXC2 and SPXC3 are briefly described.

The first transistor T1 of the first pixel circuit SPXC1 may include a first gate electrode GE1, a first active pattern ACT1, a first source area SE1, and a first drain area DE1.

The first gate electrode GE1 may be connected to a second source area SE2 of the second transistor T2 through a first conductive pattern CP1. The first gate electrode GE1 may be the second conductive layer.

The first conductive pattern CP1 may be the third conductive layer, and may electrically connect the first gate electrode GE1 and the second source area SE2 through a corresponding contact hole CH.

The first active pattern ACT1, the first source area SE1, and the first drain area DE1 may be a semiconductor pattern formed of poly silicon, amorphous silicon, an oxide semiconductor, or the like. For example, the first source area SE1 and the first drain area DE1 may be formed of a semiconductor layer doped with an impurity, and the first active pattern ACT1 may be formed of a semiconductor layer that is not doped with an impurity.

The first active pattern ACT1, the first source area SE1, and the first drain area DE1 may be provided and/or formed on the buffer layer BFL.

The first active pattern ACT1 may be a channel area of the first pixel transistor T1 as an area that overlaps the first gate electrode GE1.

The first source area SE1 may be connected to one end of the first active pattern ACT1 and may be connected to a first lower metal layer (or bottom metal layer) BML1 through a corresponding contact hole CH.

The first lower metal layer BML1 may be the first conductive layer and may be connected to the first source area SE1 through a corresponding contact hole CH. When the first lower metal layer BML1 is connected to the first source area SE1, a driving range of a voltage (e.g., a predetermined voltage) supplied to the first gate electrode GE1 may be widened. In addition, as the first lower metal layer BML1 is electrically connected to the first transistor T1, floating of the first lower metal layer BML1 may be prevented.

The first drain area DE1 may be connected to another end of the first active pattern ACT1 and may be connected to the first vertical power line PL1a through a corresponding contact hole CH.

The second transistor T2 may include a second gate electrode GE2, a second active pattern ACT2, a second source area SE2, and a second drain area DE2.

The second gate electrode GE2 may be provided integrally with the first connection line CNL1 to receive a signal (e.g., a predetermined signal, for example, the scan signal) through the first horizontal scan line S1_2. According to one or more embodiments, the second gate electrode GE2 may be provided integrally with the connection line CNL as shown in FIG. 5B to receive the signal (e.g., the predetermined signal) through the first horizontal scan line S1_2.

The second active pattern ACT2, the second source area SE2, and the second drain area DE2 may be a semiconductor pattern and may be disposed on the buffer layer BFL.

The second active pattern ACT2 may be a channel area of the second transistor T2 as an area that overlaps the second gate electrode GE2.

The second source area SE2 may be connected to one end of the second active pattern ACT2, and may be connected to the first gate electrode GE1 through the first conductive pattern CP1.

The second drain area DE2 may be connected to another end of the second active pattern ACT2, and may be connected to the first data line D1 through a third conductive pattern CP3.

The third conductive pattern CP3 may be the third conductive layer, and may connect the first data line D1 and the second drain area DE2 through a corresponding contact hole CH.

The third transistor T3 may include a third gate electrode GE3, a third active pattern ACT3, a third source area SE3, and a third drain area DE3.

The third gate electrode GE3 may be provided integrally with the second connection line CNL2 to receive a signal (e.g., a predetermined signal, for example, the control signal) through the second horizontal scan line S2_2. According to one or more embodiments, the third gate electrode GE3 may be provided integrally with the connection line CNL as shown in FIG. 5B to receive the signal (e.g., the predetermined signal) through the first horizontal scan line S1_2.

The third active pattern ACT3, the third source area SE3, and the third drain area DE3 may be a semiconductor pattern and may be disposed on the buffer layer BFL.

The third active pattern ACT3 may be a channel area of the third pixel transistor T3 as an area that overlaps the third gate electrode GE3.

The third source area SE3 may be connected to one end of the third active pattern ACT3 and may be connected to the first lower metal layer BML1 through a corresponding contact hole CH.

The third drain area DE3 may be connected to another end of the third active pattern ACT3 and may be connected to the initialization power line IPL through the second conductive pattern CP2.

The first storage capacitor Cst1 may include a first lower electrode LE1 and a first upper electrode UE1.

The first lower electrode LE1 may be provided integrally with the first gate electrode GE1.

In a plan view, the first upper electrode UE1 may overlap the first lower electrode LE1 and may have a size (or an area) greater than that of the first lower electrode LE1, but is not limited thereto. In a plan view, the first upper electrode UE1 may overlap each of the first source area SE1 and the third source area SE3. The first upper electrode UE1 may be the third conductive layer.

The first upper electrode UE1 may be connected to the first lower metal layer BML1 through a corresponding contact hole CH. The first upper electrode UE1 may be electrically and/or physically connected to the first and third source areas SE1 and SE3 through the first lower metal layer BML1.

The second pixel circuit SPXC2 may include the first transistor T1, the second transistor T2, the third transistor T3, and a second storage capacitor Cst2.

The first transistor T1 may include a first gate electrode GE1, a first active pattern ACT1, a first source area SE1, and a first drain area DE1.

The first source area SE1 may be connected to the first active pattern ACT1 and may be connected to a second lower metal layer BML2 through a corresponding contact hole CH.

The second lower metal layer BML2 may be the first conductive layer and may overlap the first transistor T1. The second lower metal layer BML2 may be connected to the first source area SE1 through the contact hole CH, and may be connected to a third source area SE3 of the third transistor T3 through another corresponding contact hole CH. In addition, the second lower metal layer BML2 may be connected to a second upper electrode UE2 of the second storage capacitor Cst2 through another corresponding contact hole CH.

The second transistor T2 may include a second gate electrode GE2, a second active pattern ACT2, a second source area SE2, and a second drain area DE2.

The second source area SE2 may be connected to the second active pattern ACT2 and may be connected to a seventh conductive pattern CP7 through a corresponding contact hole CH.

The seventh conductive pattern CP7 may be the third conductive layer, and may connect the second source area SE2 and the first gate electrode GE1 through a corresponding contact hole CH.

The second drain area DE2 may be connected to the second active pattern ACT2, and may be connected to the second data line D2 through an eighth conductive pattern CP8.

The eighth conductive pattern CP8 may be the third conductive layer, and may connect the second drain area DE2 and the second data line D2 through a corresponding contact hole CH.

The third transistor T3 may include a third gate electrode GE3, a third active pattern ACT3, a third source area SE3, and a third drain area DE3.

The third source area SE3 may be connected to the third active pattern ACT3 and may be connected to a second lower metal layer BML2 through a corresponding contact hole CH.

The third drain area DE3 may be connected to the third active pattern ACT3 and may be connected to the initialization power line IPL through the fifth conductive pattern CP5.

The second storage capacitor Cst2 may include a second lower electrode LE2 and a second upper electrode UE2.

The second lower electrode LE2 may be the second conductive layer, and may be provided integrally with the second gate electrode GE2.

The second upper electrode UE2 may be the third conductive layer and may overlap the second lower electrode LE2.

The third pixel circuit SPXC3 may include a first transistor T1, a second transistor T2, a third transistor T3, and a third storage capacitor Cst3.

The first transistor T1 may include a first gate electrode GE1, a first active pattern ACT1, a first source area SE1, and a first drain area DE1.

The first source area SE1 may be connected to the first active pattern ACT1, and may be connected to a third lower metal layer BML3 through a corresponding contact hole CH.

The third lower metal layer BML3 may be the first conductive layer and may overlap the first transistor T1. The third lower metal layer BML3 may be connected to the first source area SE1 through the contact hole CH and may be connected to the third source area SE3 of the third transistor T3 through another corresponding contact hole CH. In addition, the third lower metal layer BML3 may be connected to a third upper electrode UE3 of the third storage capacitor Cst3 through another corresponding contact hole CH.

The second transistor T2 may include a second gate electrode GE2, a second active pattern ACT2, a second source area SE2, and a second drain area DE2.

The second source area SE2 may be connected to the second active pattern ACT2 and may be connected to a fourth conductive pattern CP4 through a corresponding contact hole CH.

The fourth conductive pattern CP4 may be the third conductive layer, and may connect the second source area SE2 and the first gate electrode GE1 through a corresponding contact hole CH.

The second drain area DE2 may be connected to the second active pattern ACT2, and may be connected to the third data line D3 through a sixth conductive pattern CP6.

The sixth conductive pattern CP6 may be the third conductive layer, and may connect the second drain area DE2 and the third data line D3 through a corresponding contact hole CH.

The third transistor T3 may include a third gate electrode GE3, a third active pattern ACT3, a third source area SE3, and a third drain area DE3.

The third source area SE3 may be connected to the third active pattern ACT3 and may be connected to the third lower metal layer BML3 through a corresponding contact hole CH.

The third drain area DE3 may be connected to the third active pattern ACT3, and may be connected to the initialization power line IPL through the fifth conductive pattern CP5.

The third storage capacitor Cst3 may include a third lower electrode LE3 and the third upper electrode UE3.

The third lower electrode LE3 may be the second conductive layer and may be provided integrally with the third gate electrode GE3.

The third upper electrode UE3 may be the third conductive layer and may overlap the third lower electrode LE3.

The first, second, and third pixel circuits SPXC1, SPXC2, and SPXC3 having the above-described configuration may be covered by the passivation layer PSV.

The above-described passivation layer PSV may include a plurality of via holes positioned in the pixel area PXA in which each pixel PXL is disposed. For example, the passivation layer PSV may include first via holes VIH1, second via holes VIH2, and third via holes VIH3.

The first via holes VIH1 may expose one area of the first upper electrode UE1, one area of the second upper electrode UE2, and one area of the third upper electrode UE3, respectively. In one or more embodiments, the number of first via holes VIH1 positioned in the pixel area PXA may be three, but is not limited thereto.

The second via holes VIH2 may expose one area of the second horizontal power line PL2b, another area of the second horizontal power line PL2b, and still another area of the second horizontal power line PL2b, respectively. In one or more embodiments, the number of second via holes VIH2 positioned in the pixel area PXA may be three, but is not limited thereto.

The third via holes VIH3 may expose one area of the first horizontal power line PL1b, another area of the first horizontal power line PL1b, and still another area of the first horizontal power line PL1b, respectively. In an embodiment, the number of third via holes VIH3 positioned in the pixel area PXA may be three, but is not limited thereto.

The display element layer DPL including the light emitting element LD described with reference to FIGS. 1 and 2 may be disposed on the pixel circuit layer PCL described above, and some configurations of the display element layer DPL may be electrically connected to some configurations of the pixel circuit layer PCL through a corresponding via hole. For example, each of the first, second, and third upper electrodes UE1, UE2, and UE3 may be electrically connected to a first alignment electrode ALE1 of the display element layer DPL through a corresponding first via hole VIH1. The second horizontal power line PL2b may be electrically connected to a third alignment electrode ALE3 of the display element layer DPL through a corresponding second via hole VIH2. The first horizontal power line PL1b may be electrically connected to the first alignment electrode ALE1 of the display element layer DPL through a corresponding third via hole VIH3.

A detailed description of an electrical connection relationship between the pixel circuit layer PCL and the display element layer DPL is described later with reference to FIGS. 7 to 13.

Hereinafter, configurations of the display element layer DPL is described with reference to FIGS. 7 and 8.

Figure 7:
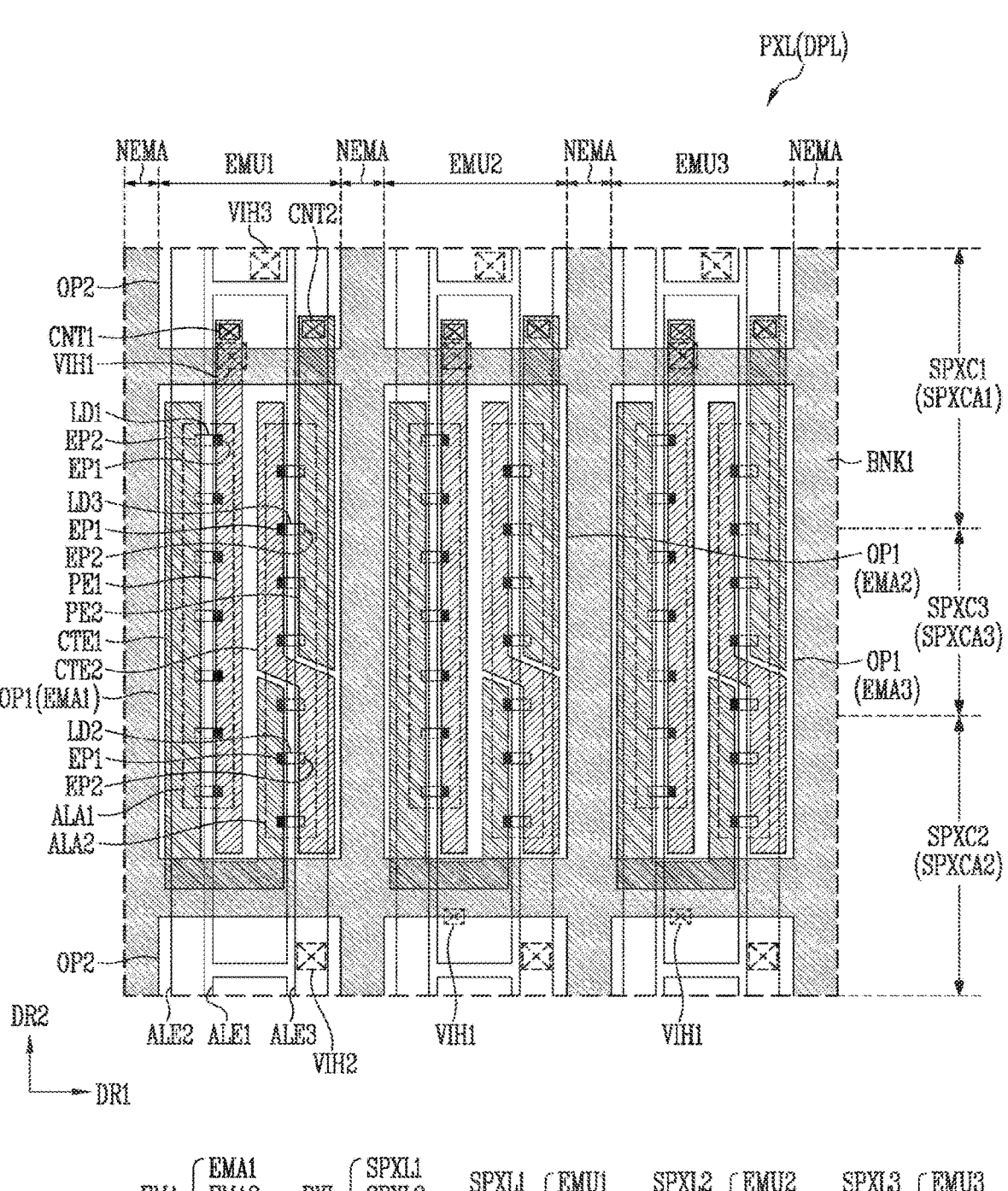
FIG. 7 is a schematic plan view illustrating a pixel area including a display element layer of the pixel shown in FIG. 3.
Figure 8:
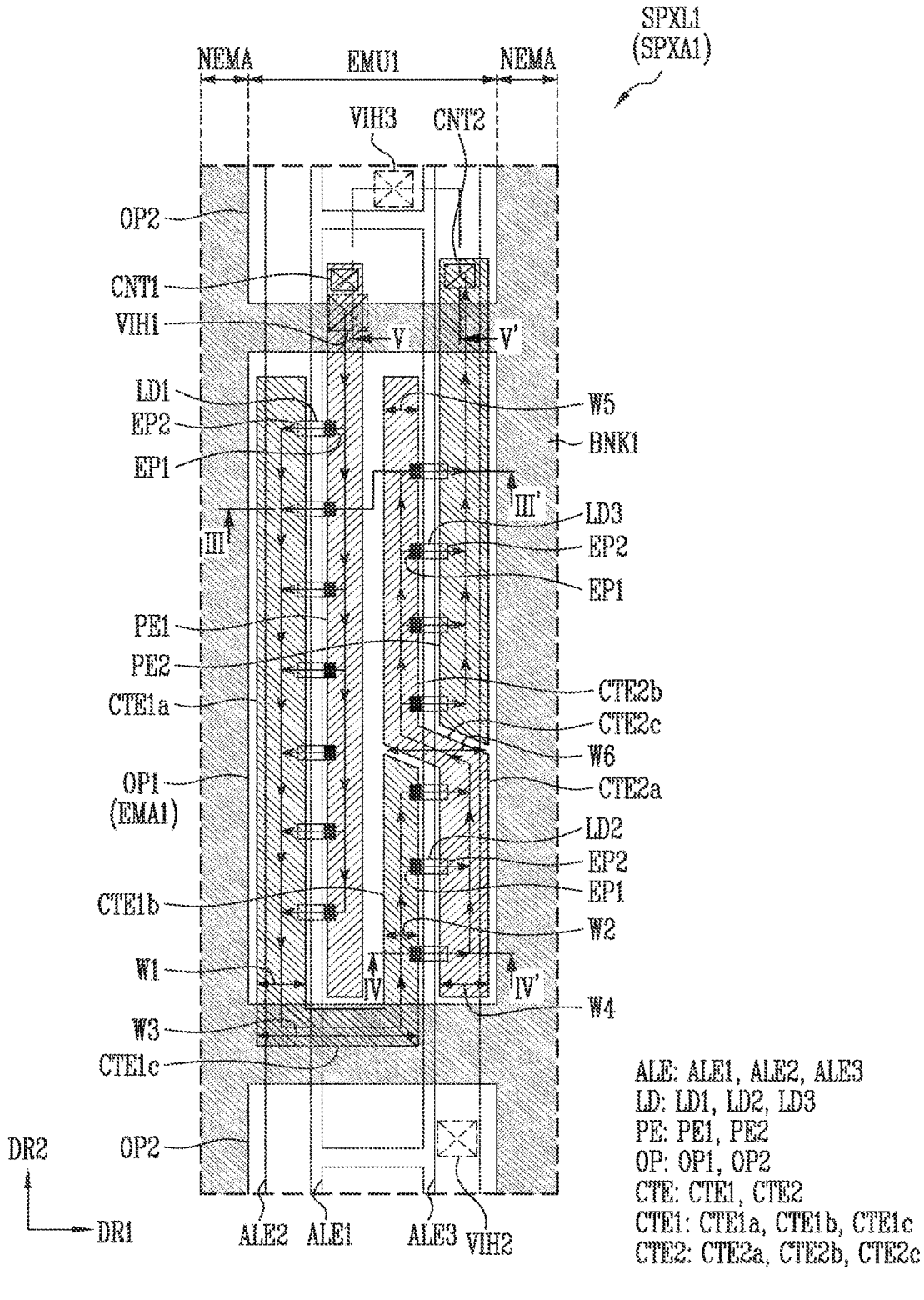
FIG. 8 is a schematic plan view illustrating flow of a driving current flowing through a first light emitting unit of a first sub-pixel shown in FIG. 7.

FIG. 7 is a schematic plan view illustrating the pixel area including the display element layer DPL of the pixel PXL shown in FIG. 3, and FIG. 8 is a schematic plan view illustrating flow of a driving current flowing through a first light emitting unit EMU1 of the first sub-pixel SPXL1 shown in FIG. 7.

In one or more embodiments of FIG. 7, the display element layer DPL of the pixel PXL may be positioned on the pixel circuit layer PCL of the pixel PXL of FIG. 5 to overlap the pixel circuit layer PCL.

For example, FIG. 7 schematically shows an embodiment of a structure of the display element layer DPL based on the pixel area PXA in which the pixel PXL of FIG. 3 is disposed.

In FIGS. 7 and 8, for convenience of description, a horizontal direction on a plane is indicated as a first direction DR1 and a vertical direction on the plane is indicated as a second direction DR2.

Referring to FIGS. 1 to 8, the display element layer DPL of the pixel PXL may include light emitting units EMU1, EMU2, and EMU3 disposed in the pixel area PXA. For example, the display element layer DPL may include the first light emitting unit EMU1, a second light emitting unit EMU2, and a third light emitting unit EMU3.

The first light emitting unit EMU1 may include the light emitting elements LD electrically connected to the first pixel circuit SPXC1 to emit light and electrodes (or electrode patterns) electrically connected to the light emitting elements LD. The electrically connected first light emitting unit EMU1 and first pixel circuit SPXC1 may configure the first sub-pixel SPXL1 of each pixel PXL.

The second light emitting unit EMU2 may include the light emitting elements LD electrically connected to the second pixel circuit SPXC2 to emit light and electrodes electrically connected to the light emitting elements LD. The electrically connected second light emitting unit EMU2 and second pixel circuit SPXC2 may configure the second sub-pixel SPXL2 of the corresponding pixel PXL.

The third light emitting unit EMU3 may include the light emitting elements LD electrically connected to the third pixel circuit SPXC3 to emit light and electrodes electrically connected to the light emitting elements LD. The electrically connected third light emitting unit EMU3 and third pixel circuit SPXC3 may configure the third sub-pixel SPXL3 of the corresponding pixel PXL.

Each pixel PXL may include a first sub-pixel area SPXA1 in which the first sub-pixel SPXL1 is disposed, a second sub-pixel area SPXA2 in which the second sub-pixel SPXL2 is disposed, and a third sub-pixel area SPXA3 in which the third sub-pixel SPXL3 is disposed.

The first sub-pixel SPXL1 may include a first emission area EMA1, the second sub-pixel SPXL2 may include a second emission area EMA2, and the third sub-pixel SPXL3 may include a third emission area EMA3. The first emission area EMA1, the second emission area EMA2, and the third emission area EMA3 may be positioned along the first direction DR1. The first, second, and third emission areas EMA1, EMA2, and EMA3 may configure the emission area EMA of each pixel PXL. A non-emission area NEMA may be disposed between the first, second, and third emission areas EMA1, EMA2, and EMA3.

The display element layer DPL may include a first bank BNK1 positioned in the non-emission area NEMA.

The first bank BNK1 may be a pixel defining layer as a structure defining (or partitioning) the emission area of each of adjacent sub-pixels. For example, the first bank BNK1 may be a structure defining the first emission area EMA1 of the first sub-pixel SPXL1, the second emission area EMA2 of the second sub-pixel SPXL2, and the third emission area EMA3 of the third sub-pixel SPXL3. In a process of supplying (or inputting) the light emitting elements LD to each of the first, second, and third sub-pixels SPXL1, SPXL2, and SPXL3, the first bank BNK1 may be a pixel defining layer or a dam structure defining a supply position of the light emitting elements LD. For example, as the first, second, and third emission areas EMA1, EMA2, and EMA3 are partitioned (or defined) by the first bank BNK1, a mixed solution (for example, ink) including a desired amount and/or a type of light emitting element LD may be supplied (or input) to the emission area EMA.

According to one or more embodiments, the first bank BNK1 may be configured to include at least one light blocking material and/or reflective material (or scattering material) to prevent a light leakage defect in which light (or rays) leaks between adjacent sub-pixels. According to one or more embodiments, the first bank BNK1 may include a transparent material (or substance). The transparent material may include, for example, polyamides resin, polyimides resin, and the like, but is not limited thereto. According to one or more embodiments, a reflective material layer may be separately provided and/or formed on the first bank BNK1 to further improve efficiency of light emitted from each of the first, second, and third sub-pixels SPXL1, SPXL2, and SPXL3.

The first bank BNK1 may include at least one opening OP exposing some configurations of the display element layer DPL. For example, the first bank BNK1 may include a first opening OP1 and a second opening OP2 exposing configurations positioned under the first bank BNK1 in the display element layer DPL. In one or more embodiments, each of the first, second, and third emission areas EMA1, EMA2, and EMA3 and the first opening OP1 of the first bank BNK1 may correspond to each other.

In each of the first, second, and third sub-pixel areas SPXA1, SPXA2, and SPXA3, the second opening OP2 may be positioned to be spaced from the first opening OP1, and may be positioned adjacent to one side (for example, an upper side and/or a lower side) of a corresponding sub-pixel area. In one or more embodiments, the second opening OP2 may be an electrode separation area in which at least one alignment electrode ALE is separated from at least one alignment electrode ALE provided to sub-pixels adjacent in the second direction DR2.

The display element layer DPL may include the pixel electrodes PE provided in each of at least first, second, and third emission areas EMA1, EMA2, and EMA3, the light emitting elements LD electrically connected to the pixel electrodes PE, and the alignment electrodes ALE provided at positions corresponding to the pixel electrodes PE. For example, the first and second pixel electrodes PE1 and PE2, the light emitting elements LD, and the first to third alignment electrodes ALE1, ALE2, and ALE3 may be disposed in each of the first, second, and third emission areas EMA1, EMA2, and EMA3. In addition, the first intermediate electrode CTE1 and the second intermediate electrode CTE2 may be disposed in each of the first, second, and third emission areas EMA1, EMA2, and EMA3. The number, a shape, a size, an arrangement structure, and the like of each of the pixel electrodes PE and/or the alignment electrodes ALE may be variously changed according to a structure of the first, second, and third sub-pixels SPXL1, SPXL2, and SPXL3 (in particular, the first, second, and third light emitting units EMU1, EMU2, and EMU3).

The first light emitting unit EMU1, the second light emitting unit EMU2, and the third light emitting unit EMU3 may have substantially similar or identical structures. Hereinafter, configurations of the first light emitting unit EMU1 are described based on the first sub-pixel SPXL1 including the first light emitting unit EMU1.

In one or more embodiments, the alignment electrodes ALE, the light emitting elements LD, and the pixel electrodes PE may be sequentially provided based on one surface of the substrate SUB on which the first sub-pixel SPXL1 is provided, but the present disclosure is not limited thereto. According to one or more embodiments, a position and a formation order of the electrode patterns configuring the first sub-pixel SPXL1 (or the first light emitting unit EMU1) may be variously changed.

The alignment electrodes ALE may include a second alignment electrode ALE2, a first alignment electrode ALE1, and a third alignment electrode ALE3 arranged to be spaced from each other in the first direction DR1.

At least one of the first, second, and third alignment electrodes ALE1, ALE2, and ALE3 may be separated from another electrode (for example, the alignment electrode ALE provided to a sub-pixel adjacent to the first sub-pixel SPXL1 in the second direction DR2) in the second opening OP2 (or the electrode separation area) after the light emitting elements LD are supplied to and aligned in the first emission area EMA1 during a manufacturing process of the display device. For example, one end of the first alignment electrode ALE1 may be separated from the first alignment electrode ALE1 of a sub-pixel positioned at one side (for example, an upper side and/or a lower side) of the first sub-pixel SPXL1 in the second direction DR2 in the second opening OP2.

In a plan view, the second alignment electrode ALE2, the first alignment electrode ALE1, and the third alignment electrode ALE3 may be arranged along the first direction DR1 in at least the first emission area EMA1. The first, second, and third alignment electrodes ALE1, ALE2, and ALE3 may be disposed to be spaced from each other.

In at least the first emission area EMA1, the first alignment electrode ALE1 may be electrically connected to the first upper electrode UE1 of the first pixel circuit SPXC1 through the corresponding first via hole VIH1 (e.g., see FIG. 6). The first via hole VIH1 may be formed by removing an insulating layer positioned between the first alignment electrode ALE1 and the first upper electrode UE1, for example, an area of the passivation layer PSV (e.g., see FIG. 6). The first alignment electrode ALE1 may be electrically connected to the first pixel electrode PE1 through a first contact portion CNT1 in the second opening OP2 of the first bank BNK1. The first contact portion CNT1 may be formed by removing a portion of at least one insulating layer positioned between the first alignment electrode ALE1 and the first pixel electrode PE1.

The first horizontal power line PL1b, the first alignment electrode ALE1, and the first pixel electrode PE1 may be electrically connected to each other through the first via hole VIH1 and the first contact portion CNT1.

In addition, the first alignment electrode ALE1 positioned in the second opening OP2 of the first bank BNK1 may be electrically connected to the first horizontal power line PL1b of the first pixel circuit SPXC1 through the corresponding third via hole VIH3 (e.g., see FIG. 6). The first alignment electrode ALE1 electrically connected to the first horizontal power line PL1b through the third via hole VIH3 may be utilized as a first alignment line in a step of aligning the light emitting elements LD in the first emission area EMA1. A first alignment signal (or a first alignment voltage) may be applied to the first alignment electrode ALE1. The third via hole VIH3 may be formed by removing one area of the passivation layer PSV positioned between the first alignment electrode ALE1 and the first horizontal power supply line PL1b. Before the light emitting elements LD are aligned in the first emission area EMA1, the first alignment electrodes ALE1 disposed in sub-pixels adjacent in the second direction DR2 may be connected to each other and may be separated in the second opening OP2 of the first bank BNK1 after the light emitting elements LD are aligned.

The third alignment electrode ALE3 may be electrically connected to the second horizontal power line PL2b through the second via hole VIH2 corresponding to the second opening OP2 of the first bank BNK1 (e.g., see FIG. 6). The second via hole VIH2 may be formed by removing one area of the passivation layer PSV positioned between the third alignment electrode ALE3 and the second horizontal power line PL2b. In addition, the third alignment electrode ALE3 may be electrically connected to the second pixel electrode PE2 through a second contact portion CNT2 in the second opening OP2. The second contact portion CNT2 may be formed by removing a portion of at least one insulating layer positioned between the third alignment electrode ALE3 and the second pixel electrode PE2. The second horizontal power line PL2b, the third alignment electrode ALE3, and the second pixel electrode PE2 may be electrically connected to each other through the second via hole VIH2 and the second contact portion CNT2.

In at least the first emission area EMA1, the second alignment electrode ALE2, the first alignment electrode ALE1, and the third alignment electrode ALE3 may be disposed to be spaced from the alignment electrode ALE adjacent along the first direction DR1. For example, the second alignment electrode ALE2 may be disposed to be spaced from one side of the first alignment electrode ALE1 in the first direction DR1, the first alignment electrode ALE1 may be disposed to be spaced from each of the second and third alignment electrodes ALE2 and ALE3 in the first direction DR1, and the third alignment electrode ALE3 may be disposed to be spaced from another side of the first alignment electrode ALE1 in the first direction DR1. A distance between the second alignment electrode ALE2 and the first alignment electrode ALE1 and a distance between the first alignment electrode ALE1 and the third alignment electrode ALE3 may be identical to or different from each other.

Each of the first, second, and third alignment electrodes ALE1, ALE2, and ALE3 may be utilized as an alignment electrode (or an alignment line) for alignment of the light emitting elements LD by receiving a signal (e.g., a predetermined signal) before the light emitting elements LD are aligned in the first emission area EMA1.

The first alignment electrode ALE1 may receive a first alignment signal in the alignment step of the light emitting elements LD, and the second and third alignment electrodes ALE2 and ALE3 may receive a second alignment signal in the alignment step of the light emitting elements LD. The above-described first and second alignment signals may be signals having a voltage difference and/or a phase difference sufficient to align the light emitting elements LD between the alignment electrodes ALE. At least one of the first and second alignment signals may be an AC signal, but is not limited thereto. In one or more embodiments, the first alignment signal supplied to the first alignment electrode ALE1 may be an AC signal, and the second alignment signal supplied to each of the second and third alignment electrodes ALE2 and ALE3 may be a ground voltage.

Each of the first, second, and third alignment electrodes ALE1, ALE2, and ALE3 may be provided in a bar shape having a constant width along the second direction DR2, but is not limited thereto. According to one or more embodiments, the first, second, and third alignment electrodes ALE1, ALE2, and ALE3 may or may not have a curved portion in the non-emission area NEMA and/or the second opening OP2 of the first bank BNK1 that is the electrode separation area, and a shape and/or a size of an area other than the first emission area EMA1 may not be particularly limited and may be variously changed.

A bank pattern for changing a surface profile (or shape) of the alignment electrode ALE to guide the light emitted from the light emitting elements LD in an image display direction of the display device may be positioned under the above-described alignment electrode ALE. The bank pattern may be a support member supporting the alignment electrode ALE. Such a bank pattern is described later with reference to FIGS. 9 to 11.

At least two to tens of light emitting elements LD may be aligned and/or provided in the first emission area EMA1 (or the first sub-pixel area SPXA1), but the number of light emitting elements LD is not limited thereto. According to one or more embodiments, the number of light emitting elements LD aligned and/or provided in the first emission area EMA1 may be variously changed.

The light emitting elements LD may be respectively disposed between the first alignment electrode ALE1 and the second alignment electrode ALE2 and between the first alignment electrode ALE1 and the third alignment electrode ALE3. Each of the light emitting elements LD may include a first end EP1 (or one end) and a second end EP2 (or another end) positioned at both ends in a length direction thereof. In one or more embodiments, the second semiconductor layer 13 of FIG. 1 including the P-type semiconductor layer may be positioned at the first end EP1, and the second semiconductor layer 11 of FIG. 1 including the N-type semiconductor layer may be positioned at the second end EP2. The light emitting elements LD may be respectively connected in parallel between the first alignment electrode ALE1 and the second alignment electrode ALE2 and between the first alignment electrode ALE1 and the third alignment electrode ALE3.

The light emitting elements LD may be disposed to be spaced from each other and may be aligned substantially parallel to each other. A distance at which the light emitting elements LD are spaced is not particularly limited. According to one or more embodiments, a plurality of light emitting elements LD may be disposed adjacent to each other to form a group, and a plurality of other light emitting elements LD may form a group while being spaced from each other by a constant distance, may have non-uniform density, and may be aligned in one direction.

Each of the light emitting elements LD may emit any one of color light and/or white light. Each of the light emitting elements LD may be respectively disposed between the first alignment electrode ALE1 and the second alignment electrode ALE2 and between the first alignment electrode ALE1 and the third alignment electrode ALE3 so that the length direction is parallel to the first direction DR1. According to one or more embodiments, at least some of the light emitting elements LD may be respectively alignment between the first alignment electrode ALE1 and the second alignment electrode ALE2 and between the first alignment electrode ALE1 and the third alignment electrode ALE3 so as not to completely parallel to the first direction DR1. The light emitting elements LD may be provided in a sprayed (or dispersed) form in a solution (for example, ink) and may be input (or supplied) to the first emission area EMA1.

The light emitting elements LD may be input (or supplied) to the first emission area EMA1 through an inkjet printing method, a slit coating method, or other various methods. For example, the light emitting elements LD may be mixed with a volatile solvent and input (or supplied) to the first emission area EMA1 through an inkjet printing method or a slit coating method. At this time, when an alignment signal corresponding to each of the first, second, and third alignment electrodes ALE1, ALE2 and ALE3 is applied, an electric field may be formed between the first alignment electrode ALE1 and the second alignment electrode ALE2 and between the first alignment electrode ALE1 and the third alignment electrode ALE3, respectively. Accordingly, the light emitting elements LD may be aligned between the first alignment electrode ALE1 and the second alignment electrode ALE2 and between the first alignment electrode ALE1 and the third alignment electrode ALE3, respectively. The light emitting elements LD may be stably aligned between the first alignment electrode ALE1 and the second alignment electrode ALE2 and between the first alignment electrode ALE1 and the third alignment electrode ALE3, respectively, by volatilizing the solvent or removing the solvent in another method after the light emitting elements LD are aligned.

In one or more embodiments, the light emitting elements LD may include the first light emitting element LD1, the second light emitting element LD2, and the third light emitting element LD3.

The first light emitting element LD1 may be aligned between one side of the first alignment electrode ALE1 and the second alignment electrode ALE2 to be electrically connected to the first pixel electrode PE1 and the first intermediate electrode CTE1. The second light emitting element LD2 may be aligned between another side of the first alignment electrode ALE1 and the third alignment electrode ALE3 to be electrically connected to the first intermediate electrode CTE1 and the second intermediate electrode CTE2. The third light emitting element LD3 may be aligned between the other side of the first alignment electrode ALE1 and the third alignment electrode ALE3 to be electrically connected to the second intermediate electrode CTE2 and the second pixel electrode PE2. In a plan view, the second light emitting elements LD2 may be aligned at a lower end of an area between the other side of the first alignment electrode ALE1 and the third alignment electrode ALE3, and the third light emitting elements LD3 may be aligned at an upper end of the area.

A plurality of first, second, and third light emitting elements LD1, LD2, and LD3 may be provided. The first end EP1 of each of the first light emitting elements LD1 may be electrically connected to the first pixel electrode PE1, and the second end EP2 of each of the first light emitting elements LD1 may be electrically connected to the first intermediate electrode CTE1. The first end EP1 of each of the second light emitting elements LD2 may be electrically connected to the first intermediate electrode CTE1, and the second end EP2 of each of the second light emitting elements LD2 may be electrically connected to the second intermediate electrode CTE2. The first end EP1 of each of the third light emitting elements LD3 may be electrically connected to the second intermediate electrode CTE2, and the second end EP2 of each of the third light emitting elements LD3 may be electrically connected to the second pixel electrode PE2.

The plurality of first light emitting elements LD1 may be connected in parallel between the first pixel electrode PE1 and the first intermediate electrode CTE1, the plurality of second light emitting elements LD2 may be connected in parallel between the first intermediate electrode CTE1 and the second intermediate electrode CTE2, and the plurality of third light emitting elements LD3 may be connected in parallel between the second intermediate electrode CTE2 and the second pixel electrode PE2.

According to one or more embodiments, each of the first light emitting element LD1, the second light emitting element LD2, and the third light emitting element LD3 may be an ultra-small light emitting diode, for example, having a size as small as a nano scale (or nano meter) to a micro scale (or a micro meter), using a material of an inorganic crystal structure. For example, the first light emitting element LD1, the second light emitting element LD2, and the third light emitting element LD3 may be the light emitting element LD described with reference to FIGS. 1 and 2.

The pixel electrodes PE and the intermediate electrode CTE may be provided in at least the first emission area EMA1, and each of the pixel electrodes PE and the intermediate electrode CTE may be provided at a position corresponding to at least one alignment electrode ALE and the light emitting elements LD. For example, each of the pixel electrodes PE and each intermediate electrode CTE may be formed on each alignment electrode ALE and the corresponding light emitting elements LD to overlap each alignment electrode ALE and the corresponding light emitting elements LD, to be electrically connected to at least light emitting elements LD.

The first pixel electrode PE1 (or the first electrode) may be formed on one side of the first alignment electrode ALE1 and the first end EP1 of each of the first light emitting elements LD1 to be electrically connected to the first end EP1 of each of the first light emitting elements LD1. The first pixel electrode PE1 may have a bar shape (or an "|" shape) having a constant width along an extension direction thereof.

The second pixel electrode PE2 (or the second electrode) may be electrically connected to one area (for example, an upper area) of the third alignment electrode ALE3 and the second end EP2 of each of the third light emitting elements LD3. In addition, the second pixel electrode PE2 may be electrically connected to the first and second light emitting elements LD1 and LD2 via at least one intermediate electrode CTE and/or the light emitting elements LD. The second pixel electrode PE2 may have a bar shape (or an "|" shape) having a constant width along an extension direction thereof.

The first intermediate electrode CTE1 may be formed on the second alignment electrode ALE2 and the second end EP2 of each of the first light emitting elements LD1 to be electrically connected to the second end EP2 of each of the first light emitting elements LD1. In addition, the first intermediate electrode CTE1 may be formed on another side of a lower area of the first alignment electrode ALE1 and the first end EP1 of each of the second light emitting elements LD2 to be electrically connected to the first end EP1 of each of the second light emitting elements LD2. The above-described first intermediate electrode CTE1 may be a first bridge electrode (or a first connection member) electrically connecting the first series stage SET1 (or the first light emitting elements LD1) and the second series stage SET2 (or the second light emitting elements LD2).

The first intermediate electrode CTE1 may have a shape that is bent at least once to surround at least one side of the first pixel electrode PE1.

In one or more embodiments, the first intermediate electrode CTE1 may include a first straight line portion CTE1a, a second straight line portion CTE1b, and a connection portion CTE1c.

The first straight line portion CTE1a may be positioned in at least the first emission area EMA1, may extend in the second direction DR2, may overlap the second alignment electrode ALE2, and may be positioned between the first pixel electrode PE1 and the first bank BNK1. The first straight line portion CTE1a may have a bar shape (or an "|" shape) having a constant width W1 in an extension direction.

The second straight line portion CTE1b may be positioned in at least the first emission area EMA1, may extend in the second direction DR2, may overlap another side of the lower area of the first alignment electrode ALE1, and may be positioned between a lower area of the first pixel electrode PE1 and a first portion CTE2a of the second intermediate electrode CTE2. The second straight line portion CTE1b may have a bar shape (or an "|" shape) having a constant width W2 in an extension direction.

The width W1 of the first straight line portion CTE1a and the width W2 of the second straight line portion CTE1b may be identical to or different from each other. Because the first straight line portion CTE1a overlaps the second alignment electrode ALE2 and the second straight line portion CTE1b overlaps the other side of the lower area of the first alignment electrode ALE1, the first straight line portion CTE1a and the second straight line portion CTE1b may be positioned in different columns. In one or more embodiments, the second straight line portion CTE1b may be positioned in the same column as a second portion CTE2b of the second intermediate electrode CTE2.

The connection portion CTE1c may be positioned between the first straight line portion CTE1a and the second straight line portion CTE1b to connect the first straight line portion CTE1a and the second straight line portion CTE1b. The connection portion CTE1c may be positioned in at least the non-emission area NEMA to overlap the first bank BNK1. The connection portion CTE1c may have a constant width W3 in the first direction DR1.

The first straight line portion CTE1a, the second straight line portion CTE1b, and the connection portion CTE1c described above may be integrally provided and connected to each other.

The first intermediate electrode CTE1 may be electrically connected to the first pixel electrode PE1 through at least the first light emitting element LD1, and may be connected to the second pixel electrode PE2 through at least the second and third light emitting elements LD2 and LD3.

The first pixel electrode PE1 and the first intermediate electrode CTE1 may configure the first series stage SET1 of the first light emitting unit EMU1 together with the first light emitting elements LD1 connected in parallel therebetween. The first pixel electrode PE1 may be an anode of the first light emitting unit EMU1.

The second intermediate electrode CTE2 may be formed on one area (for example, a lower area) of the third alignment electrode ALE3 and the second end EP2 of each of the second light emitting elements LD2 to be electrically connected to the second end EP2 of each of the second light emitting elements LD2. In addition, the second intermediate electrode CTE2 may be formed on another side of an upper area of the first alignment electrode ALE1 and the first end EP1 of each of the third light emitting elements LD3 to be electrically connected to the first end EP1 of each of the third light emitting elements LD3. The above-described second intermediate electrode CTE2 may be a second bridge electrode (or a second connection member) connecting the second series stage SET2 (or the second light emitting elements LD2) and the third series stage SET3 (or the third light emitting elements LD3).

The second intermediate electrode CTE2 may have a shape that is bent at least once. In one or more embodiments, the second intermediate electrode CTE2 may include the first portion CTE2a, the second portion CTE2b, and a diagonal line portion CTE2c.

The first portion CTE2a (or a third straight line portion) may overlap the lower area of the third alignment electrode ALE3, may extend in the second direction DR2, and may have a bar shape (or an "|" shape) having a constant width W4 in an extension direction. The first portion CTE2a may face (e.g., oppose) the second straight line portion CTE1b of the first intermediate electrode CTE1 and may be positioned between the second straight line portion CTE1b and the first bank BNK1.

The second portion CTE2b (or a fourth straight line portion) may overlap the other side of the upper area of the first alignment electrode ALE1, may extend in the second direction DR2, and may have a bar shape (or an "|" shape) having a constant width W5 in an extension direction. The second portion CTE2b may be positioned between the upper area of the first pixel electrode PE1 and the second pixel electrode PE2 in a plan view.

As the first portion CTE2a overlaps the lower area of the third alignment electrode ALE3 and the second portion CTE2b overlaps the other side of the upper area of the first alignment electrode ALE1, the first portion CTE2a and the second portion CTE2b may be positioned in different columns. For example, the first portion CTE2a may be positioned in the same column as the second pixel electrode PE2, and the second portion CTE2b may be positioned in the same column as the second straight line portion CTE1b of the first intermediate electrode CTE1.

The diagonal line portion CTE2c may be positioned between the first portion CTE2a and the second portion CTE2b to connect the first portion CTE2a and the second portion CTE2b. The diagonal line portion CTE2c may have at least two widths W6 in the first direction DR1, and may extend in a diagonal line direction inclined to the second direction DR2. One inclined surface of the diagonal line portion CTE2c may face (e.g., oppose) the first intermediate electrode CTE1, and another inclined surface of the diagonal line portion CTE2c may face (e.g., oppose) the second pixel electrode PE2.

The first portion CTE2a, the second portion CTE2b, and the diagonal line portion CTE2c described above may be integrally provided and connected to each other.

The first light emitting element LD1 may be connected to the second light emitting element LD2 in series through the first intermediate electrode CTE1, and the second light emitting element LD2 may be connected to the third light emitting element LD3 in series through the second intermediate electrode CTE2.

The first intermediate electrode CTE1 and the second intermediate electrode CTE2 may configure the second series stage SET2 of the first light emitting unit EMU1 together with the second light emitting elements LD2 connected in parallel therebetween. The second intermediate electrode CTE2 and the second pixel electrode PE2 may configure the third series stage SET3 of the first light emitting unit EMU1 together with the third light emitting elements LD3 connected in parallel therebetween. The second pixel electrode PE2 may be a cathode of the first light emitting unit EMU1.

During each frame period, in the first sub-pixel SPXL1, the driving current may flow from the first pixel electrode PE1 to the second pixel electrode PE2 through the first light emitting element LD1, the first intermediate electrode CTE1, the second light emitting element LD2, the second intermediate electrode CTE2, and the third light emitting element LD3.

When it is assumed that the driving current flows from the first power line PL1 to the second power line PL2 by the first transistor T1 included in the first pixel circuit SPXC1, the driving current may flow to the first light emitting unit EMU1 through the first via hole VIH1.

For example, the driving current may be supplied to the first alignment electrode ALE1 through the first via hole VIH1, and the driving current flows to the first intermediate electrode CTE1 via the first light emitting elements LD1 through the first pixel electrode PE1 through the first contact portion CNT1. Accordingly, in the first series stage SET1, the first light emitting elements LD1 may emit light with a luminance corresponding to a current distributed to each of the first light emitting elements LD1.

The driving current flowing to the first intermediate electrode CTE1 flows to the second intermediate electrode CTE2 via the second light emitting elements LD2. Accordingly, in the second series stage SET2, the second light emitting elements LD2 may emit light with a luminance corresponding to a current distributed to each of the second light emitting elements LD2.

The driving current flowing to the second intermediate electrode CTE2 flows to the second pixel electrode PE2 via the third light emitting elements LD3. Accordingly, in the third series stage SET3, the third light emitting elements LD3 may emit light with a luminance corresponding to a current distributed to each of the third light emitting elements LD3.

In a method described above, the driving current of the first sub-pixel SPXL1 may flow while sequentially passing through the first light emitting elements LD1 of the first series stage SET1, the second light emitting elements LD2 of the second series stage SET2, and the third light emitting elements LD3 of the third series stage SET3. Accordingly, the first sub-pixel SPXL1 may emit light with a luminance corresponding to the data signal supplied during each frame period.

According to the above-described embodiment, when the alignment electrodes ALE are disposed in an order of the second alignment electrode ALE2, the first alignment electrode ALE1, and the third alignment electrode ALE3 in the first emission area EMA1, an AC signal is applied to the first alignment electrode ALE1, and a ground signal is applied to each of the second and third alignment electrodes ALE2 and ALE3, an electric field may be formed between the first alignment electrode ALE1 and the second alignment electrode ALE2 and between the first alignment electrode ALE1 and the third alignment electrode ALE3, respectively. At this time, when the light emitting elements LD are input to the first emission area EMA1, the light emitting elements LD may be aligned in an area ALA1 (hereinafter referred to as a "first alignment area") between the first alignment electrode ALE1 and the second alignment electrode ALE2) and an area ALA2 (hereinafter referred to as a "second alignment area") between the first alignment electrode ALE1 and the third alignment electrode AEL3. That is, two alignment areas ALA1 and ALA2 may be provided in the first emission area EMA1. At this time, the first end EP1 of each of the light emitting elements LD may face (e.g., oppose) the first alignment electrode ALE1 and may overlap the first alignment electrode ALE1.

The first pixel electrode PE1 is disposed in the first emission area EMA1 to be electrically connected to the first end EP1 of each of the light emitting elements LD aligned in the first alignment area ALA1. In addition, the first intermediate electrode CTE1 is disposed in the first emission area EMA1 to be electrically connected to the second end EP2 of each of the light emitting elements LD and electrically connected to the first end EP1 of each of some light emitting elements LD aligned in the second alignment area ALA2. In addition, the second intermediate electrode CTE2 electrically connected to the second end EP2 of some of the light emitting elements LD and electrically connected to the first end EP1 of remaining light emitting elements LD aligned in the second alignment area ALA2 is disposed in the first emission area EMA1. In addition, the second pixel electrode PE2 is disposed in the first emission area EMA1 to be electrically connected to the second end EP2 of each of the remaining light emitting elements LD aligned in the second alignment area ALA2.

When the first pixel electrode PE1, the first intermediate electrode CTE1, the second intermediate electrode CTE2, and the second pixel electrode PE2 described above are disposed in the first emission area EMA1, the light emitting elements LD aligned in the second alignment area ALA2 may be divided into two groups of light emitting elements LD electrically connected to different electrodes according to positions thereof. For example, the light emitting elements LD aligned in the second alignment area ALA2 may be divided into the second light emitting elements LD2 and the third light emitting elements LD3. In one or more embodiments, the second light emitting elements LD2 may be positioned in a lower area in the second alignment area ALA2, and the third light emitting elements LD3 may be positioned in an upper area in the second alignment area ALA2. The diagonal line portion CTE2c of the second intermediate electrode CTE2 may be positioned between the lower area of the second alignment area ALA2 and the upper area of the second alignment area ALA2.

The second light emitting elements LD2 positioned in the lower area of the second alignment area ALA2 may be electrically connected to the second straight line portion CTE1b of the first intermediate electrode CTE1 and the first portion CTE2a of the second intermediate electrode CTE2 to configure the second series stage SET2 of the first light emitting unit EMU1 together with the first and second intermediate electrodes CTE1 and CTE2. The third light emitting elements LD3 positioned in the upper area of the second alignment area ALA2 may be electrically connected to the second portion CTE2b of the second intermediate electrode CTE2 and the second pixel electrode PE2 to configure the third series stage SET3 of the first light emitting unit EMU1 together with the second intermediate electrode CTE2 and the second pixel electrode PE2.

The light emitting elements LD aligned in the first alignment area ALA1 may be the first light emitting elements LD1 electrically connected to the first pixel electrode PE1 and the first straight line portion CTE1a of the first intermediate electrode CTE1. The first light emitting elements LD1 may configure the first series stage SET1 of the first light emitting unit EMU1 together with the first pixel electrode PE1 and the first intermediate electrode CTE1.

According to the above-described embodiment, the first pixel electrode PE1, the first intermediate electrode CTE1, the second intermediate electrode CTE2, and the second pixel electrode PE2 described above may be disposed in the first emission area where two alignment areas ALA1 and ALA2 are provided, to implement the first light emitting unit EMU1 including the first, second, and third series stages SET1, SET2, and SET3. In this case, the first light emitting unit EMU1 may secure the area in which the light emitting elements LD are aligned, compared to a light emitting unit including four series stages in two alignment areas, and may increase the number of effective light sources, thereby further improving light output efficiency of the first emission area EMA1. In addition, even though a defect occurs in one of the first, second, and third series stages SET1, SET2, and SET3, the first light emitting unit EMU1 may relatively reduce a ratio in which light emitting elements LD that do not emit due to the defect compared to a light emitting unit including two series stages in two alignment areas, thereby alleviating reduction of light output efficiency of the light emitting elements LD. Accordingly, a defect in which the first emission area EMA1 (or the first sub-pixel SPXL1) is recognized as a dark spot may be reduced.

According to the above-described embodiment, the first light emitting element LD1, the second light emitting element LD2, and the third light emitting element LD3 may be connected in series through the first intermediate electrode CTE1 and the second intermediate electrode CTE2 between the first pixel electrode PE1 and the second pixel electrode PE2. In such a method, the first light emitting unit EMU1 of the first sub-pixel SPXL1 may be configured by connecting the light emitting elements LD aligned in the first emission area EMA1 in a series/parallel mixed structure. Accordingly, configuring the first light emitting unit EMU1 in the series/parallel mixed structure including the three series stages SET1, SET2, and SET3 while minimizing the area occupied by the alignment electrode ALE (or without increasing the number of alignment electrodes ALE) becomes possible, and thus a high-resolution and high-definition display device may be easily implemented.

In addition, according to the above-described embodiment, the first end EP1 of each of the first light emitting elements LD1, the first end EP1 of each of the second light emitting elements LD2, and the first end EP1 of each of the third light emitting elements LD3 may overlap the first alignment electrode ALE1 positioned at a center in the first emission area EMA1. For example, the first end EP1 of each of the first light emitting elements LD1, the first end EP1 of each of the second light emitting elements LD2, and the first end EP1 of each of the third light emitting elements LD3 may be positioned adjacent to the center in the first emission area EMA1.

The P-type semiconductor layer (or the second semiconductor layer 13) positioned relatively adjacent to the active layer 12 of the corresponding light emitting element LD compared to the N-type semiconductor layer (or the first semiconductor layer 11) may be positioned at the first end EP1 of each of the first, second, and third light emitting elements LD1, LD2, and LD3. When the first end EP1 of the first, second, and third light emitting elements LD1, LD2, and LD3 are positioned adjacent to the center of the first emission area EMA1, light emitted from the active layer 12 may be focused toward the first end EP1 of the corresponding light emitting element LD. In this case, intensity of light emitted from the center of the first emission area EMA1 may increase, and thus light output efficiency of the first sub-pixel SPXL1 may be improved. Hereinafter, a stacked structure of the first sub-pixel SPXL1 according to the above-described embodiment is mainly described with reference to FIGS. 9 to 13.

Figure 9:
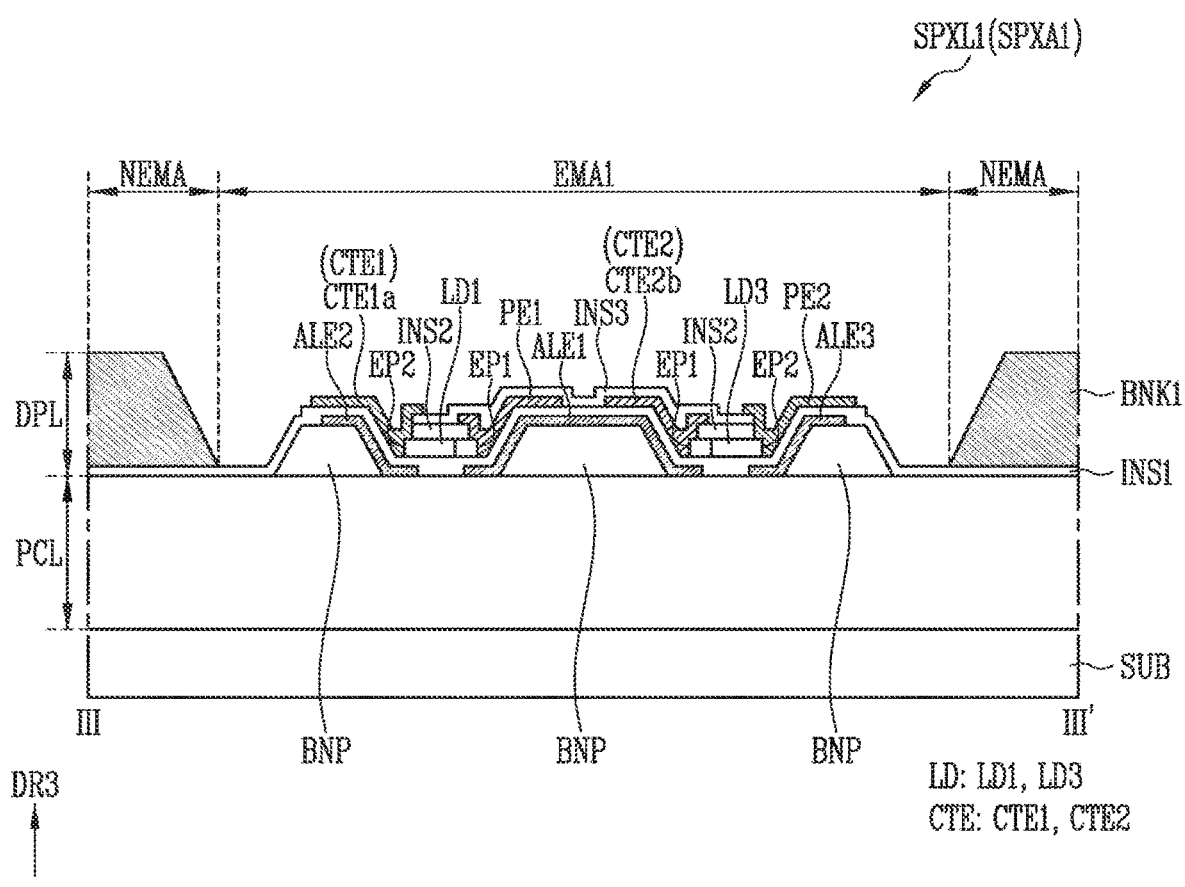
FIGS. 9 to 11 are schematic cross-sectional views taken along the line III-II' of FIG. 8.
Figure 10:
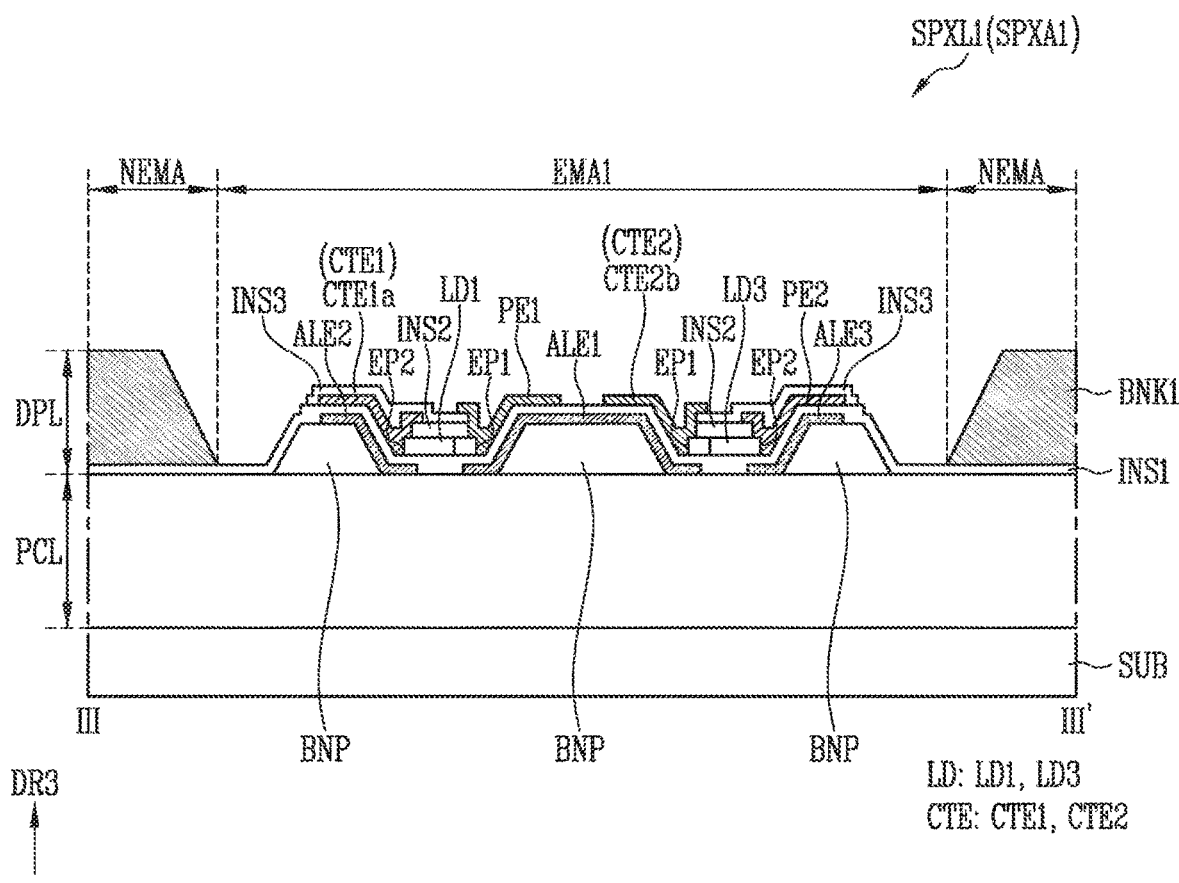
Figure 11:
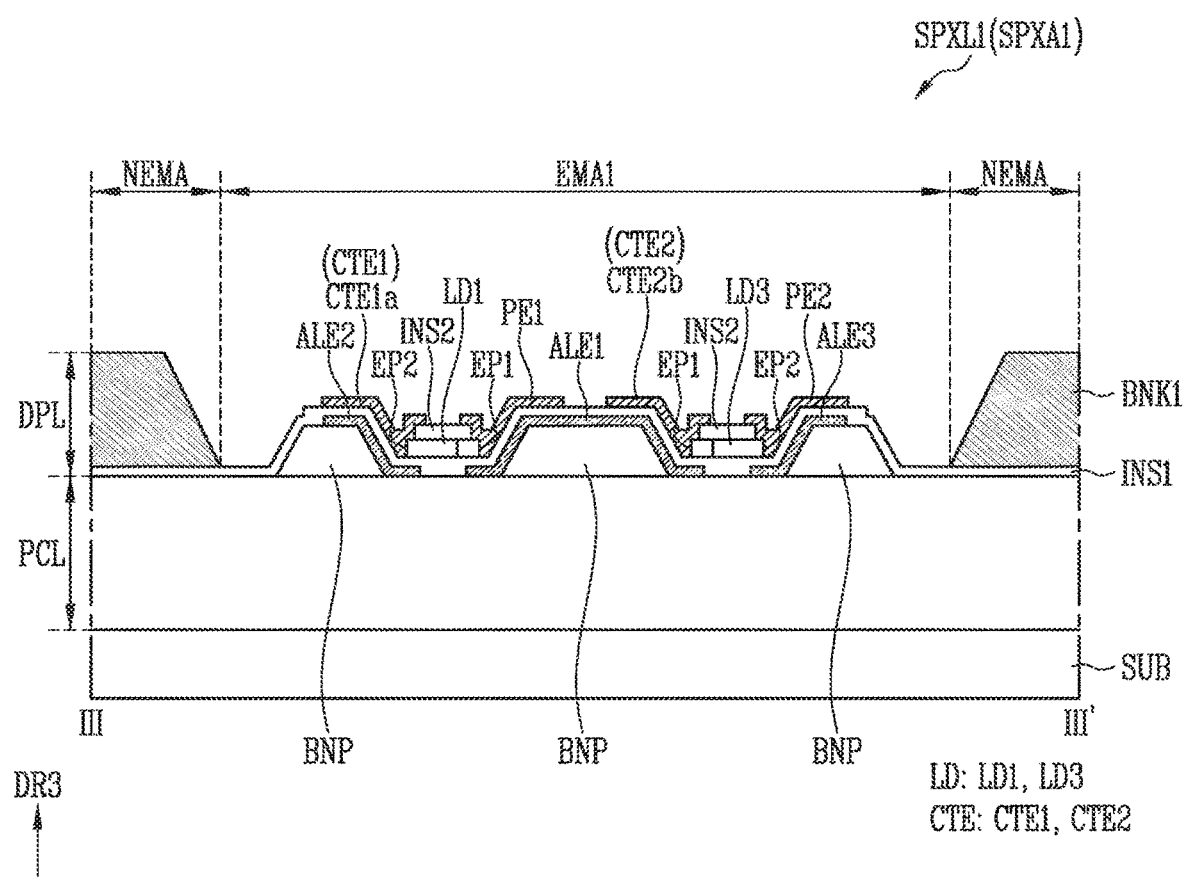
Figure 12:
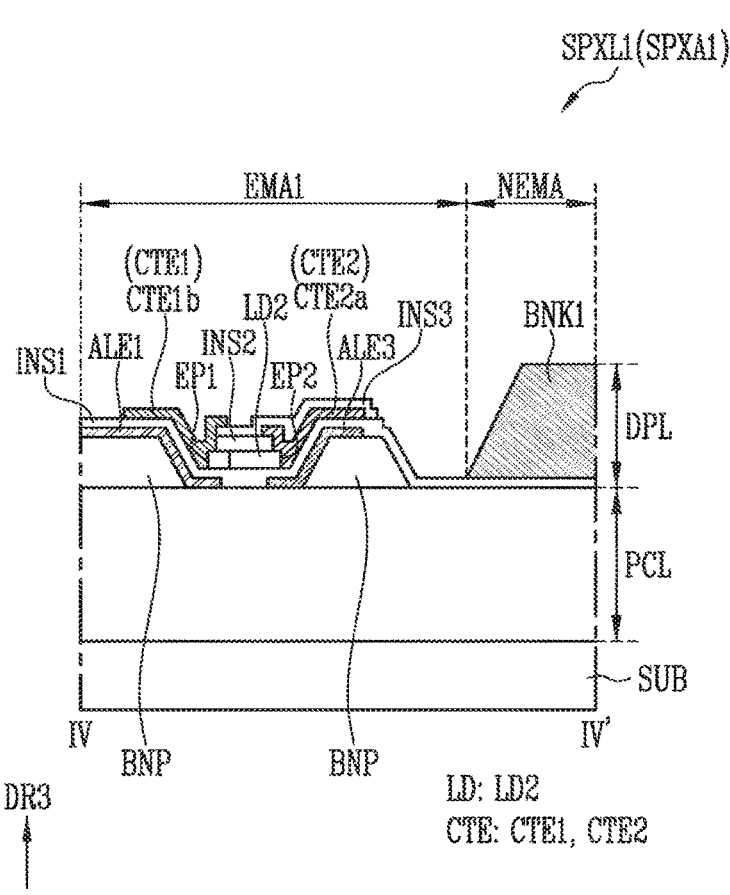
FIG. 12 is a schematic cross-sectional view taken along the line IV-IV' of FIG. 8.
Figure 13:
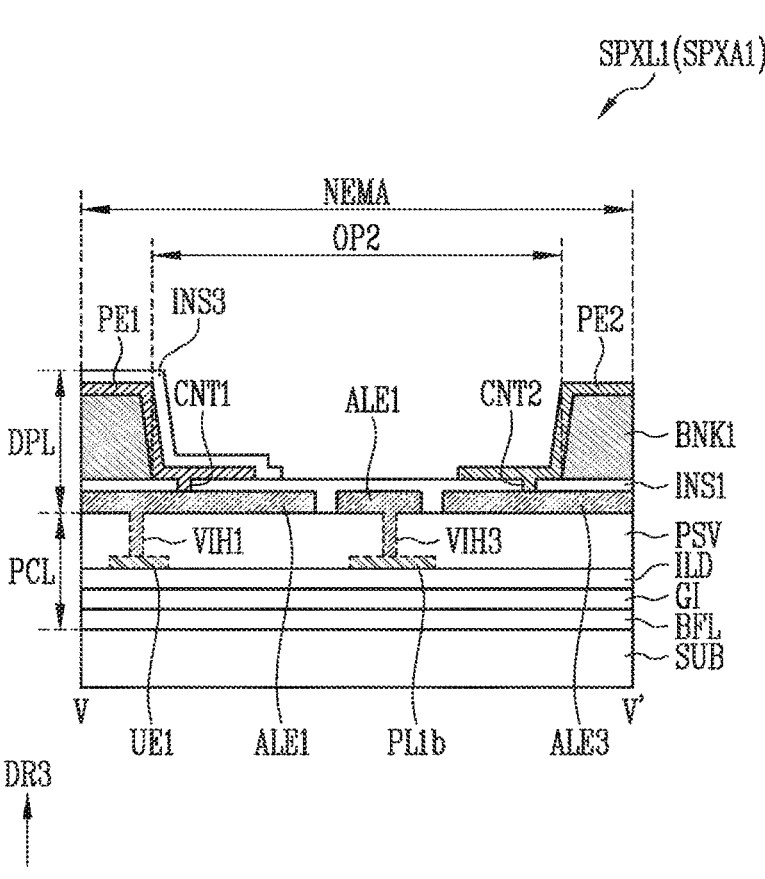
FIG. 13 is a schematic cross-sectional view taken along the line V-V' of FIG. 8.

FIGS. 9 to 11 are schematic cross-sectional views taken along the line III-III' of FIG. 8, FIG. 12 is a schematic cross-sectional view taken along the line IV-IV' of FIG. 8, and FIG. 13 is a schematic cross-sectional view taken along the line V-V' of FIG. 8.

Embodiments of FIGS. 10 and 11 illustrate modified examples of the embodiment of FIG. 8 in relation to a step of forming the pixel electrode PE and the intermediate electrode CTE and presence or absence of a third insulating layer INS3. For example, FIG. 10 discloses an embodiment in which the first pixel electrode PE1 and the second intermediate electrode CTE2 are formed after the second pixel electrode PE2, the first intermediate electrode CTE1, and the third insulating layer INS3 are formed, and FIG. 11 illustrates an embodiment in which the pixel electrodes PE and the intermediate electrodes CTE are formed in the same layer.

In FIGS. 9 to 11, the first sub-pixel SPXL1 is simplified, such as showing each electrode as a single film (or single layer) of electrode and each insulating layer as only a single film (or single layer) of insulating layer, but the present disclosure is not limited thereto.

In FIGS. 9 to 13, a height direction (or a vertical direction) on a cross-section is indicated as a third direction DR3.

Regarding the embodiments of FIGS. 9 to 13, a point different from the above-described embodiment is mainly described in order to avoid a repetitive description.

Referring to FIGS. 1 to 13, the first sub-pixel SPXL1 may include the substrate SUB, the pixel circuit layer PCL, and the display element layer DPL.

The pixel circuit layer PCL and the display element layer DPL may be disposed to overlap each other on one surface of the substrate SUB. For example, the first sub-pixel area SPXA1 of the substrate SUB may include the pixel circuit layer PCL disposed on one surface of the substrate SUB and the display element layer DPL disposed on the pixel circuit layer PCL. The pixel circuit layer PCL may include the buffer layer BFL, the gate insulating layer GI, the interlayer insulating layer ILD, and the passivation layer PSV sequentially stacked on the substrate SUB as shown in FIG. 13. Because the pixel circuit layer PCL is the same as the pixel circuit layer PCL described with reference to FIGS. 5A, 5B, and 6, a detailed description thereof is omitted.

The display element layer DPL may include the first to third alignment electrodes ALE1, ALE2, and ALE3, the light emitting elements LD, the first and second pixel electrodes PE1 and PE2, and the first and second intermediate electrodes CTE1 and CTE2.

The display element layer DPL may further include insulating patterns and/or insulating layers sequentially disposed on one surface of the pixel circuit layer PCL. For example, the display element layer DPL may further include a bank pattern BNP, a first insulating layer INS1, a first bank BNK1, a second insulating layer INS2, and a third insulating layer INS3.

The bank pattern BNP may be provided and/or formed on the pixel circuit layer PCL.

The bank pattern BNP (also referred to as a "support member" or "wall pattern") may be provided and/or formed on the passivation layer PSV of the pixel circuit layer PCL. In one or more embodiments, the bank pattern BNP may be formed in a separation type pattern individually disposed under first to third alignment electrodes ALE1, ALE2, and ALE3 so as to overlap a portion of each of the first, second, and third alignment electrodes ALE1, ALE2, and ALE3. According to one or more embodiments, the bank pattern BNP may include an opening or a recess corresponding to areas between the first, second, and third alignment electrodes ALE1, ALE2, and ALE3 in the first emission area EMA1, and may be formed in an integrated type pattern entirely connected in the display area DA.

The bank pattern BNP may protrude in the third direction DR3 on one surface of the pixel circuit layer PCL. Accordingly, one area of each of the first, second, and third alignment electrodes ALE1, ALE2, and ALE3 disposed on the bank pattern BNP may protrude in the third direction DR3 (or a thickness direction of the substrate SUB).

The bank pattern BNP may be an inorganic layer including an inorganic material or an organic layer including an organic material. According to one or more embodiments, the bank pattern BNP may include a single layer of organic layer and/or a single layer of inorganic layer, but is not limited thereto. According to one or more embodiments, the bank pattern BNP may be provided in a form of multiple layers in which at least one organic layer and at least one inorganic layer are stacked. However, a material of the bank pattern BNP is not limited to the above-described embodiment, and according to one or more embodiments, the bank pattern BNP may include a conductive material (or substance). A shape of the bank pattern BNP may be variously changed within a range capable of improving efficiency of the light emitted from the light emitting element LD.

The bank pattern BNP may be utilized as a reflective member. For example, the bank pattern BNP may be utilized as a reflective member that guides the light emitted from the light emitting element LD in a desired direction together with the first, second, and third alignment electrodes ALE1, ALE2, and ALE3 disposed thereon to improve the light output efficiency of the first sub-pixel SPXL1.

The first, second, and third alignment electrodes ALE1, ALE2, and ALE3 may be provided and/or formed on the bank pattern BNP.

The first, second, and third alignment electrodes ALE1, ALE2, and ALE3 may be provided and/or formed on the pixel circuit layer PCL (or the passivation layer PSV) and the bank pattern BNP.

The first, second, and third alignment electrodes ALE1, ALE2, and ALE3 may be disposed to be spaced from each other. The second alignment electrode ALE2, the first alignment electrode ALE1, and the third alignment electrode ALE3 may be sequentially arranged in one direction intersecting the third direction DR3, for example, in a horizontal direction. The first, second, and third alignment electrodes ALE1, ALE2, and ALE3 may be disposed on (or at) the same plane and may have substantially the same thickness in the third direction DR3. The first, second, and third alignment electrodes ALE1, ALE2, and ALE3 may be concurrently formed (e.g., simultaneously formed) in the same process.

Each of the first, second, and third alignment electrodes ALE1, ALE2, and ALE3 may have a shape corresponding to a profile of the bank pattern BNP positioned thereunder.

The first, second, and third alignment electrodes ALE1, ALE2, and ALE3 may be formed of a material having a suitable reflectance (e.g., a predetermined reflectance) in order to allow the light emitted from the light emitting element LD to proceed in the image display direction of the display device. For example, the first, second, and third alignment electrodes ALE1, ALE2, and ALE3 may be formed of a conductive material (or substance). The conductive material may include an opaque metal suitable for reflecting the light emitted from the light emitting elements LD in the image display direction of the display device (or an upper direction of the display element layer DPL). The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the first, second, and third alignment electrodes ALE1, ALE2, and ALE3 is not limited to the above-described embodiment. According to one or more embodiments, the first, second, and third alignment electrodes ALE1, ALE2, and ALE3 may include a transparent conductive material (or substance). The transparent conductive material (or substance) may include a conductive oxide such as indium tin oxide (ITO), indium zinc oxide (IZO), zinc oxide ($ZnO_x$), indium gallium zinc oxide (IGZO), and indium tin zinc oxide (ITZO), a conductive polymer such as poly(3,4-ethylenedioxythiophene) (PEDOT), and the like. When the first, second, and third alignment electrodes ALE1, ALE2, and ALE3 include a transparent conductive material (or substance), a separate conductive layer formed of an opaque metal for reflecting the light emitted from the light emitting elements LD in the image display direction of the display device may be added. However, the material of the first, second, and third alignment electrodes ALE1, ALE2, and ALE3 is not limited to the above-described materials.

The first, second, and third alignment electrodes ALE1, ALE2, and ALE3 may be provided and/or formed as a single layer, but are not limited thereto. According to one or more embodiments, the first, second, and third alignment electrodes ALE1, ALE2, and ALE3 may be provided and/or formed as multiple layers in which at least two or more materials from among metals, alloys, a conductive oxide, and conductive polymers are stacked. The first, second, and third alignment electrodes ALE1, ALE2, and ALE3 may be formed as multiple layers of at least double layers or more in order to minimize distortion due to signal delay when transmitting a signal to the both ends EP1 and EP2 of the light emitting elements LD. For example, the first, second, and third alignment electrodes ALE1, ALE2, and ALE3 may be formed as multiple layers selectively further including at least one of at least one reflective electrode layer, at least one transparent electrode layer disposed on and/or under the reflective electrode layer, at least one conductive capping layer covering an upper portion of the reflective electrode layer and/or the transparent electrode layer.

When the first, second, and third alignment electrodes ALE1, ALE2, and ALE3 are formed of a conductive material having a reflectance, the light emitted from the both ends of each of the light emitting elements LD may further proceed in the image display direction of the display device. For example, when the first, second, and third alignment electrodes ALE1, ALE2, and ALE3 are disposed to face the both ends EP1 and EP2 of each of the light emitting elements LD while the first, second, and third alignment electrodes ALE1, ALE2, and ALE3 have an inclined surface or a curved surface corresponding to the shape of the bank pattern BNP, the light emitted from the both ends EP1 and EP2 of each of the light emitting elements LD may be reflected by the first, second, and third alignment electrodes ALE1, ALE2, and ALE3 and may further proceed in the image display direction of the display device DD. Accordingly, the efficiency of the light emitted from the light emitting elements LD may be improved.

In one or more embodiments, the first alignment electrode ALE1 may be disposed in the center of the first emission area EMA1, and the second alignment electrode ALE2 and the third alignment electrode ALE3 may be disposed on both sides of the first alignment electrode ALE1. The second alignment electrode ALE2 and the third alignment electrode ALE3 may be integrally or non-integrally connected to each other to receive the same signal or power.

In one or more embodiments, as shown in FIG. 13, the first alignment electrode ALE1 may be electrically connected to the first upper electrode UE1 of the pixel circuit layer PCL of the first sub-pixel SPXL1 through the first via hole VIH1 of the passivation layer PSV in the non-emission area NEMA. In addition, the first alignment electrode ALE1 may be electrically connected to the first horizontal power line PL1*b* of the pixel circuit layer PCL through the third via hole VIH3 of the passivation layer PSV in one area of the non-emission area NEMA (for example, the second opening OP2 of the first bank BNK1).

As shown in FIG. 6, the third alignment electrode ALE3 may be electrically connected to the second horizontal power line PL2*b* of the pixel circuit layer PCL through the second via hole VIH2 of the passivation layer PSV in the non-emission area NEMA.

The first insulating layer INS1 may be disposed on the first, second, and third alignment electrodes ALE1, ALE2, and ALE3.

The first insulating layer INS1 may be entirely provided and/or formed on the first, second, and third alignment electrodes ALE1, ALE2, and ALE3, and the bank pattern BNP. The first insulating layer INS1 may be partially opened to expose configurations positioned thereunder in the non-emission area NEMA. For example, the first insulating layer INS1 may be partially opened to include at least one or more contact portions for connecting the first and third alignment electrodes ALE1 and ALE3 to the first and second pixel electrodes PE1 and PE2 in the non-emission area NEMA, respectively. According to one or more embodiments, the first insulating layer INS1 may be entirely formed on the first sub-pixel area SPXA1 in which the first, second, and third alignment electrodes ALE1, ALE2, and ALE3 are formed, and may include the contact portions CNT1 and CNT2 exposing a portion of each of the first and third alignment electrodes ALE1 and ALE3. For example, as shown in FIG. 13, the first insulating layer INS1 may be partially opened to include the first contact portion CNT1 exposing a portion of the first alignment electrode ALE1 by removing one area in at least the non-emission area NEMA, and the second contact portion CNT2 exposing a portion of the third alignment electrode ALE3 by removing another area in at least the non-emission area NEMA. Here, at least the non-emission area NEMA may be the second opening OP2 of the bank BNK, which is the electrode separation area, but is not limited thereto.

The first insulating layer INS1 may be formed of an inorganic insulating layer formed of an inorganic material. For example, the first insulating layer INS1 may be formed of an inorganic insulating layer suitable for protecting the light emitting elements LD from the pixel circuit layer PCL. For example, the first insulating layer INS1 may include at least one of silicon nitride ($SiN_x$), silicon oxide ($SiO_x$), silicon oxynitride ($SiO_xN_y$), and aluminum oxide ($AlO_x$).

According to one or more embodiment, the first insulating layer INS1 may be provided as a single layer or multiple layers. When the first insulating layer INS1 is provided as the multiple layers, the first insulating layer INS1 may be provided as a distributed Bragg reflectors structure in which a first layer and a second layer having different refractive indices formed of an inorganic layer are alternately stacked.

The first bank BNK1 may be disposed on the insulating layer INS1.

The first bank BNK1 may be provided and/or formed on the first insulating layer INS1 in the non-emission area NEMA. The first bank BNK1 may surround the first emission area EMA1 and may be formed between adjacent sub-pixels to configure a pixel defining layer that partitions the emission area of each of the sub-pixels. In the step of supplying (or inputting) the light emitting elements LD to the first emission area EMA1, the first bank BNK1 may configure a dam structure that prevents a solution (or ink) in which the light emitting elements LD are mixed from being flowed to the emission area (for example, the second emission area EMA2 and/or the third emission area EMA3) of an adjacent sub-pixel or controls an appropriate amount of solution to be supplied to each emission area.

The first bank BNK1 may be configured to include at least one light blocking material and/or reflective material (or a scattering material) to prevent a light leakage defect in which light (or rays) leaks between adjacent sub-pixels. According to one or more embodiments, the first bank BNK1 may include a transparent material (or substance). The transparent material may include, for example, polyamides resin, polyimides resin, and the like, but is not limited thereto. According to one or more embodiments, a reflective material layer may be separately provided and/or formed on the first bank BNK1 to further improve efficiency of light emitted from each sub-pixel.

The light emitting elements LD may be supplied to the first emission area EMA1 surrounded (or defined) by the first bank BNK1. For example, the light emitting elements LD may be supplied (or input) to the first emission area EMA1 through an inkjet printing method, or the like, and the light emitting elements LD may be aligned on each of a surface of the first insulating layer INS1 of the area (or the first alignment area ALA1) between the first alignment electrode ALE1 and the second alignment electrode ALE2 and a surface of the first insulating layer INS1 of the area (or the second alignment area ALA2) between the first alignment electrode ALE1 and the third alignment electrode ALE3 by an electric field formed by a suitable signal (e.g., a predetermined signal or alignment signal) applied to each of the first alignment electrode ALE1 (or the first alignment line before being divided into the first alignment electrode ALE1), the second alignment electrode ALE2 (or the second alignment line), and the third alignment electrode ALE3 (or the third alignment line). For example, the light emitting elements LD supplied to the first emission area EMA1 may be arranged so that the first ends EP1 face (e.g., oppose) the first alignment electrode ALE1 and the second ends EP2 face (e.g., oppose) the second and third alignment electrodes ALE2 and ALE3.

The light emitting elements LD may include the first light emitting element LD1, the second light emitting element LD2, and the third light emitting element LD3.

The first light emitting element LD1 may be arranged between one side of the first alignment electrode ALE1 and the second alignment electrode ALE2 adjacent to the one side of the first alignment electrode ALE1. The first light emitting element LD1 may include the first end EP1 facing (e.g., opposing) the one side of the first alignment electrode ALE1 and the second end EP2 facing (e.g., opposing) the one second alignment electrode ALE2.

The second light emitting element LD2 may be arranged between the other side of the lower area of the first alignment electrode ALE1 and the lower area of the third alignment electrode ALE3 adjacent to the first alignment electrode ALE1. The second light emitting element LD2 may include the first end EP1 facing (e.g., opposing) the other side of the lower area of the first alignment electrode ALE1 and the second end EP2 facing (e.g., opposing) the lower area of the third alignment electrode ALE3.

The third light emitting element LD3 may be arranged between the other side of the upper area of the first alignment electrode ALE1 and the upper area of the third alignment electrode ALE3 adjacent to the first alignment electrode ALE1. The third light emitting element LD3 may include the first end EP1 facing (e.g., opposing) the other side of the upper area of the first alignment electrode ALE1 and the second end EP2 facing (e.g., opposing) the upper area of the third alignment electrode ALE3.

In the first emission area EMA1, the second insulating layer INS2 (or insulating pattern) may be disposed on each of the first, second, and third light emitting elements LD1, LD2, and LD3. The second insulating layer INS2 may be positioned on the first, second, and third light emitting elements LD1, LD2, and LD3, and may partially cover an outer surface (e.g., an outer peripheral or circumferential surface or surface) of each of the first, second, and third light emitting elements LD1, LD2 and LD3 to expose the first end EP1 and the second end EP2 of each of the first, second, and third light emitting elements LD1, LD2 and LD3 to the outside.

The second insulating layer INS2 may include an inorganic insulating layer including an inorganic material or an organic insulating layer. For example, the second insulating layer INS2 may include an inorganic insulating layer suitable for protecting the active layer 12 of each of the first, second, and third light emitting elements LD1, LD2, and LD3 from external oxygen, moisture, and the like. However, the present disclosure is not limited thereto, and the second insulating layer INS2 may be configured of an organic insulating layer including an organic material according to a design condition of the display device to which the first, second, and third light emitting elements LD1, LD2, and LD3 are applied. The second insulating layer INS2 may be configured as a single layer or multiple layers.

The first, second, and third light emitting elements LD1, LD2, and LD3 may be prevented from being separated from an aligned position by forming the second insulating layer INS2 on the first, second, and third light emitting elements LD1, LD2, and LD3 of which the alignment in the first emission area EMA1 is completed.

Different electrodes from among the first pixel electrode PE1 (or the first electrode), the second pixel electrode PE2 (or the second electrode), and the intermediate electrode CTE may be formed on the both ends, for example, the first and second ends EP1 and EP2, of the first, second, and third light emitting elements LD1, LD2 and LD3 that are not covered by the second insulating layer INS2. For example, the first pixel electrode PE1 may be formed on the first end EP1 of the first light emitting element LD1, the first straight line portion CTE1a of the first intermediate electrode CTE1 may be formed on the second end EP2 of the first light emitting element LD1, the second straight line portion CTE1b of the first intermediate electrode CTE1 may be formed on the first end EP1 of the second light emitting element LD2, the first portion CTE2a of the second intermediate electrode CTE2 may be formed on the second end EP2 of the light emitting element LD2, the second portion CTE2b of the second intermediate electrode CTE2 may be formed on the first end EP1 of the third light emitting element LD3, and the second pixel electrode PE2 may be formed on the second end EP2 of the third light emitting element LD3.

The first pixel electrode PE1 (or the first electrode) may be disposed on the first alignment electrode ALE1 to overlap one side of the first alignment electrode ALE1, and the second pixel electrode PE2 (or the second electrode) may be disposed on the third alignment electrode ALE3 to overlap the upper area of the third alignment electrode ALE3.

The first straight line portion CTE1a of the first intermediate electrode CTE1 may be disposed on the second alignment electrode ALE2 to overlap a portion of the second alignment electrode ALE2, and the second straight line portion CTE1b of the first intermediate electrode CTE1 may be disposed on the first alignment electrode ALE1 to overlap the other side of the lower area of the first alignment electrode ALE1.

The first portion CET2a of the second intermediate electrode CTE2 may be disposed on the third alignment electrode ALE3 to overlap the lower area of the third alignment electrode ALE3, and the second portion CET2b of the second intermediate electrode CTE2 may be disposed on the first alignment electrode ALE1 to overlap the other side of the upper area of the first alignment electrode ALE1.

The first pixel electrode PE1, the first intermediate electrode CTE1, the second intermediate electrode CTE2, and/or the second pixel electrode PE2 may be formed in layers identical to or different from each other. For example, a mutual position and/or a formation order of the first pixel electrode PE1, the first intermediate electrode CTE1, the second intermediate electrode CTE2, and the second pixel electrode PE2 may be variously changed according to one or more embodiments.

In the embodiment of FIG. 9, the first pixel electrode PE1 and the second intermediate electrode CTE2 may be formed first on the second insulating layer INS2. The first pixel electrode PE1 may directly contact the first end EP1 of the first light emitting element LD1. The second intermediate electrode CTE2 may direct contact the second end EP2 of the second light emitting element LD2 and the first end EP1 of the third light emitting element LD3 to be connected between the second light emitting element LD2 and the third light emitting element LD3, but is not limited thereto. Thereafter, the third insulating layer INS3 may be formed in the first emission area EMA1 to cover the first pixel electrode PE1 and the second intermediate electrode CTE2. The first pixel electrode PE1 and the second intermediate electrode CTE2 may be formed concurrently (e.g., simultaneously) or successively.

The third insulating layer INS3 may be positioned on the first pixel electrode PE1 and the second intermediate electrode CTE2, and may cover the first pixel electrode PE1 and the second intermediate electrode CTE2 (e.g., preventing the first pixel electrode PE1 and the second intermediate electrode CTE2 from being exposed to the outside) to prevent corrosion or the like of the first pixel electrode PE1 and the second intermediate electrode CTE2. The third insulating layer INS3 may include an inorganic insulating layer formed of an inorganic material or an organic insulating layer formed of an organic material. For example, the third insulating layer INS3 may include at least one of silicon nitride ($SiN_x$), silicon oxide ($SiO_x$), and silicon oxynitride ($SiO_xN_y$), or at least one of a metal oxide such as aluminum oxide ($AlO_x$), but is not limited thereto. In addition, the third insulating layer INS3 may be formed as a single layer or multiple layers.

The first intermediate electrode CTE1 and the second pixel electrode PE2 may be formed on the third insulating layer INS3. The second pixel electrode PE2 may directly contact the second end EP2 of the third light emitting element LD3. The first intermediate electrode CTE1 may directly contact the second end EP2 of the first light emitting element LD1 and the first end EP1 of the second light emitting element LD2 to be connected between the first light emitting element LD1 and the second light emitting element LD2, but is not limited thereto. The second pixel electrode PE2 and the first intermediate electrode CTE1 may be formed concurrently (e.g., simultaneously) or successively.

In one or more embodiments of FIG. 10, the second pixel electrode PE2 and the first intermediate electrode CTE1 may be formed first on the second insulating layer INS2. The second pixel electrode PE2 and the first intermediate electrode CTE1 may be formed concurrently (e.g., simultaneously) or successively. Thereafter, the third insulating layer INS3 may be formed to cover the second pixel electrode PE2 and the first intermediate electrode CTE1, and the first pixel electrode PE1 and the second intermediate electrode CTE2 may be formed in the first emission area EMA1 in which the third insulating layer INS3 is formed.

As in the embodiments of FIGS. 9 and 10, when electrodes disposed on the first end EP1 and the second end EP2 of each light emitting element LD are disposed in different layers, the electrodes may be stably divided, and thus a short defect between the electrodes may be prevented.

In an embodiment of FIG. 11, the first pixel electrode PE1, the first intermediate electrode CTE1, the second intermediate electrode CTE2, and the second pixel electrode PE2 are disposed at the same layer of the display element layer DPL, and may be formed concurrently (e.g., simultaneously) or sequentially. In this case, the third insulating layer INS3 may be omitted. In the embodiment of FIG. 11, when the electrodes disposed on the first end EP1 and the second end EP2 of each light emitting element LD are concurrently (e.g., simultaneously) formed in the same layer, a manufacturing process of each sub-pixel SPXL may be simplified and process efficiency may be improved.

The first pixel electrode PE1, the first intermediate electrode CTE1, the second intermediate electrode CTE2, and the second pixel electrode PE2 may be formed of various transparent conductive materials to allow the light emitted from each of the light emitting elements LD to proceed in the image display direction (for example, the third direction DR3) of the display device without loss. For example, the first pixel electrode PE1, the first intermediate electrode CTE1, the second intermediate electrode CTE2, and the second pixel electrode PE2 may include at least one of various transparent conductive materials including indium tin oxide (ITO), indium zinc oxide (IZO), zinc oxide ($ZnO_x$), indium gallium zinc oxide (IGZO), indium tin zinc oxide (ITZO), and the like, and may be configured to be substantially transparent or translucent to satisfy a desired light transmittance (e.g., a predetermined light transmittance or transmission). However, the material of the first pixel electrode PE1, the first intermediate electrode CTE1, the second intermediate electrode CTE2, and the second pixel electrode PE2 is not limited to the above-described embodiment. According to one or more embodiments, the first pixel electrode PE1, the first intermediate electrode CTE1, the second intermediate electrode CTE2, and the second pixel electrode PE2 may be formed of various opaque conductive materials (or substances). The first pixel electrode PE1, the first intermediate electrode CTE1, the second intermediate electrode CTE2, and the second pixel electrode PE2 may be formed as a single layer or multiple layers.

According to one or more embodiments, at least one overcoat layer (for example, a layer for planarizing an upper surface of the display element layer DPL) may be further disposed on the first pixel electrode PE1, the first intermediate electrode CTE1, the second intermediate electrode CTE2, and the second pixel electrode PE2.

According to one or more embodiments, an optical layer may be selectively disposed on the display element layer DPL of each sub-pixel SPXL. For example, the optical layer may further include a color conversion layer including color conversion particles that convert the light emitted from the light emitting elements LD into light of a specific color.

Hereinafter, embodiments in which the color conversion layer is disposed on the display element layer DPL are described with reference to FIGS. 14 to 16.

Figure 14:
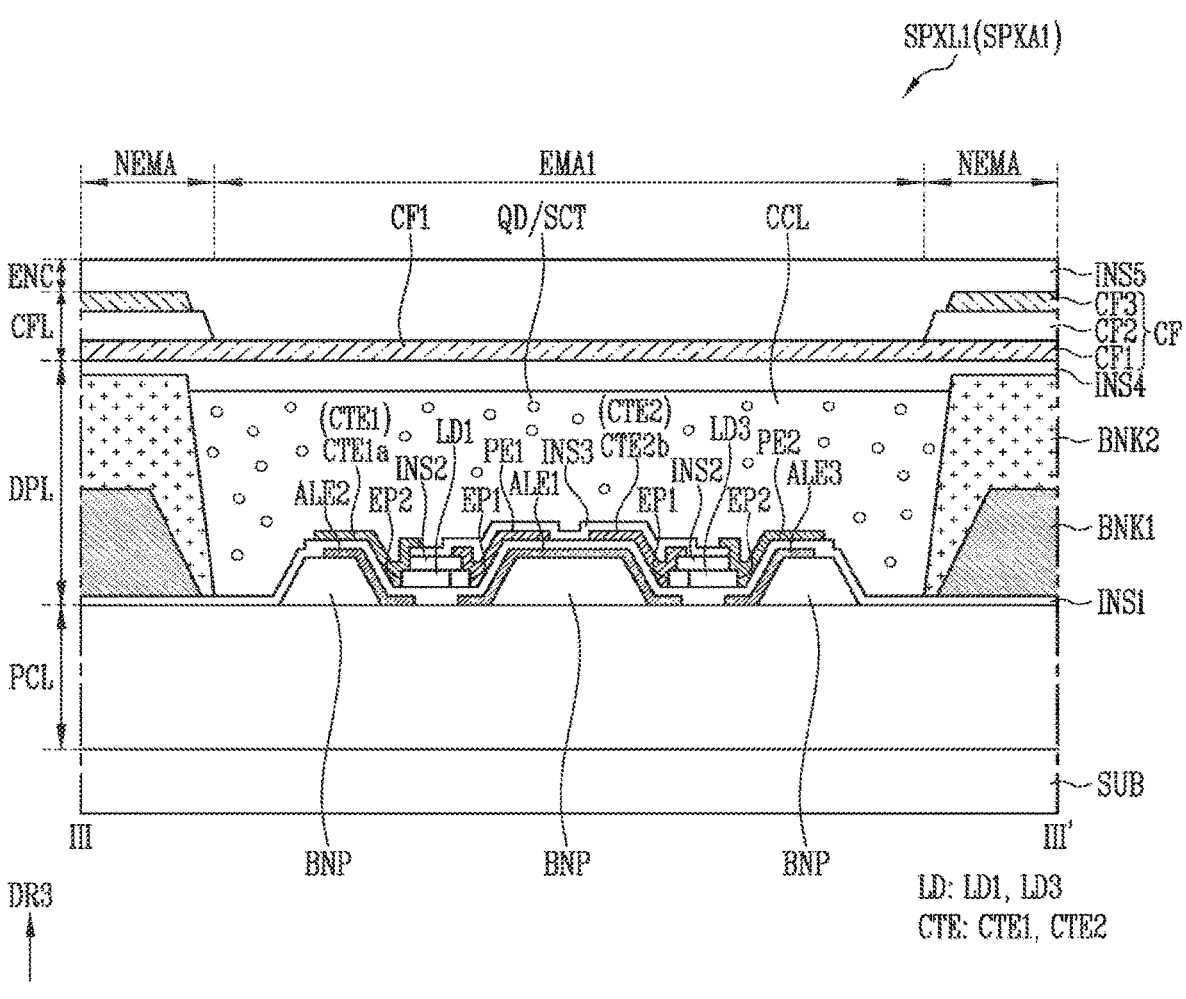
FIGS. 14 to 16 illustrates a display device according to one or more embodiments, and are schematic cross-sectional views corresponding to the line III-III' of FIG. 8.
Figure 15:
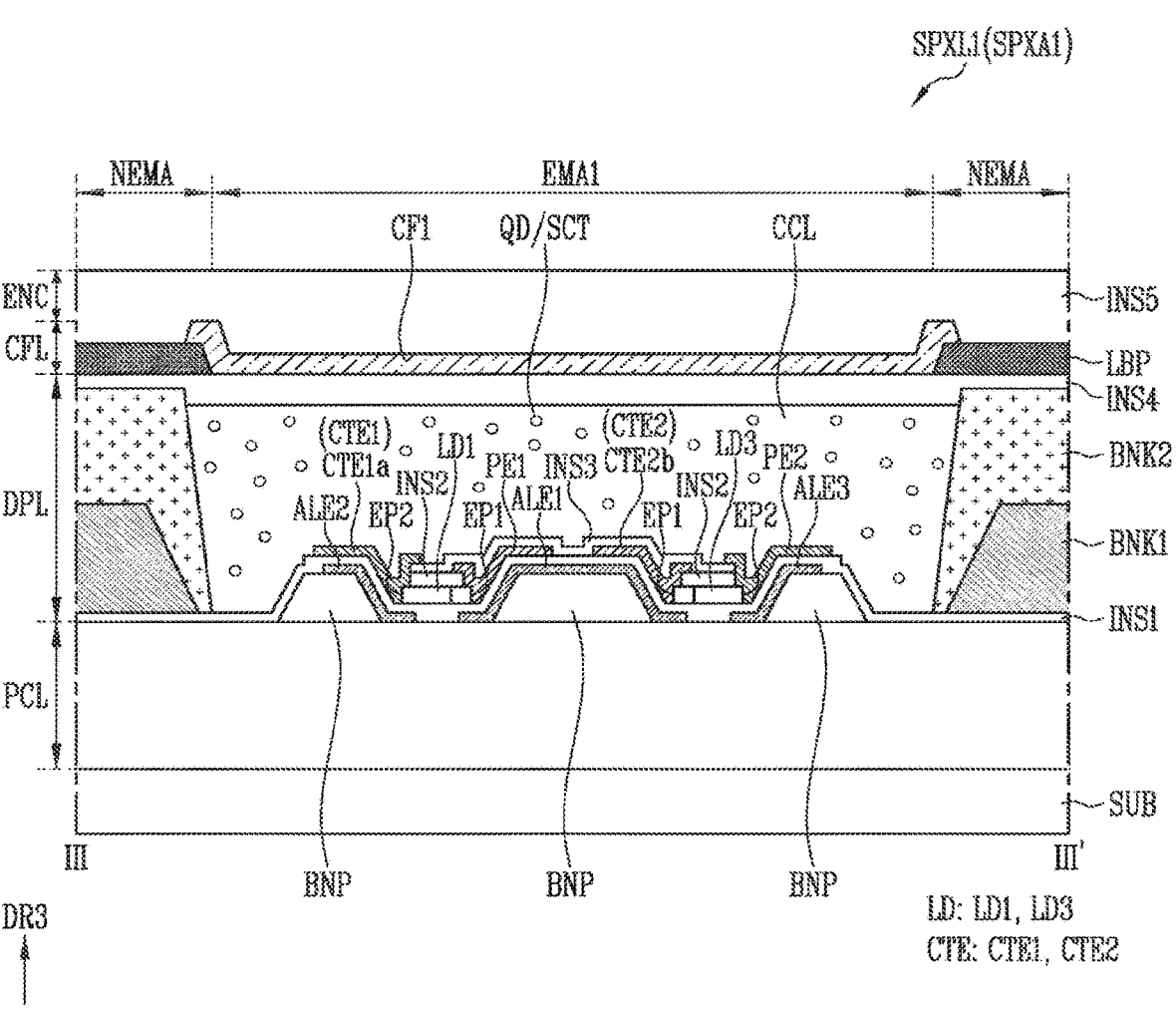
Figure 16:
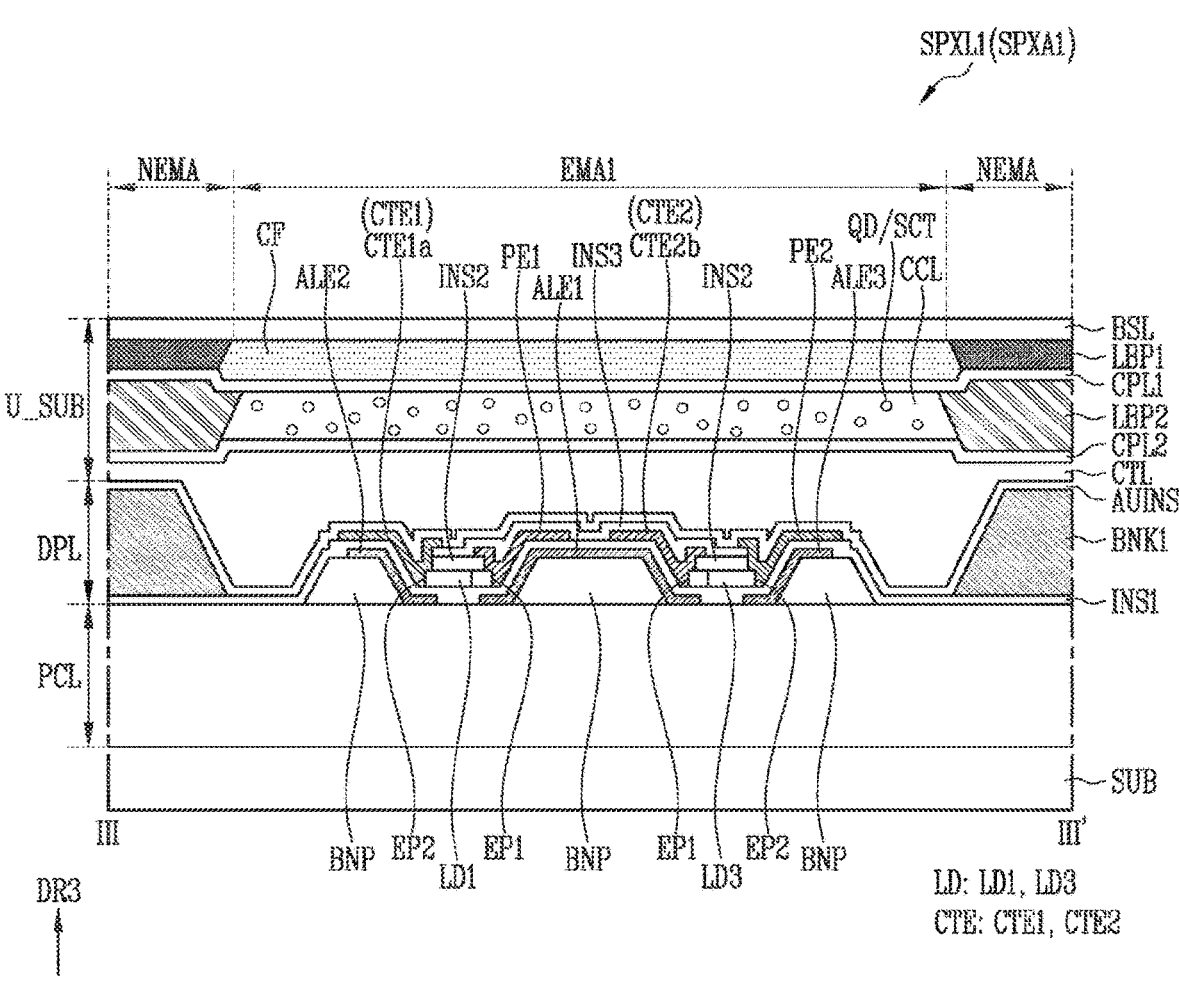

FIGS. 14 to 16 illustrates a display device according to one or more embodiments, and are schematic cross-sectional views corresponding to the line III-III' of FIG. 8.

The embodiments of FIGS. 15 and 16 show a modified example of FIG. 14 in relation to a position of the color conversion layer CCL. For example, FIG. 15 discloses an embodiment in which the color conversion layer CCL is positioned on the display element layer DPL through a successive process, and FIG. 16 discloses an embodiment in which an upper substrate U_SUB including the color conversion layer CCL is positioned on the display element layer DPL through an adhesion process using an intermediate layer CTL.

Regarding the embodiments of FIGS. 14 to 16, a point different from the above-described embodiment is mainly described in order to avoid a repetitive description.

Referring to FIGS. 1 to 16, the first sub-pixel SPXL1 may further include the color conversion layer CCL positioned in the first emission area EMA1 and a second bank BNK2 positioned in the non-emission area NEMA.

The second bank BNK2 may be provided and/or formed on the first bank BNK1 in the non-emission area NEMA of the first sub-pixel SPXL1. The second bank BNK2 may be a structure that surrounds the first emission area EMA1 and finally defines the first emission area EMA1 by defining a position to which the color conversion layer CCL is to be supplied. For example, the second bank BNK2 may be a structure that finally sets the first emission area EMA1 by defining a position where the color conversion layer CCL is supplied (or input) to the first sub pixel SPXL1.

The second bank BNK2 may include a light blocking material. For example, the second bank BNK2 may be a black matrix. According to one or more embodiments, the second bank BNK2 may be configured to include at least one light blocking material and/or reflective material to allow light emitted from the color conversion layer CCL to further proceed in the image display direction (or the third direction DR3), thereby improving light output efficiency of the color conversion layer CCL.

The color conversion layer CCL may be formed on the first pixel electrode PE1, the first intermediate electrode CTE1, the second intermediate electrode CTE2, and the second pixel electrode PE2 in the first emission area EMA1 surrounded by the second bank BNK2.

The color conversion layer CCL may include color conversion particles QD corresponding to a specific color. For example, the color conversion layer CCL may include the color conversion particles QD that convert light of a first color emitted from the light emitting elements LD into light of a second color (or the specific color).

When the first sub-pixel SPXL1 is a red pixel (or a red sub-pixel), the color conversion layer CCL may include color conversion particles QD of a red quantum dot that converts the light of the first color emitted from the light emitting elements LD into the light of the second color, for example, light of a red color.

When the first sub-pixel SPXL1 is a green pixel (or a green sub-pixel), the color conversion layer CCL may include color conversion particles QD of a green quantum dot that converts the light of the first color emitted from the light emitting elements LD into the light of the second color, for example, light of a green color.

When the first sub-pixel SPXL1 is a blue pixel (or a blue sub-pixel), the color conversion layer CCL may include color conversion particles QD of a blue quantum dot that converts the light of the first color emitted from the light emitting elements LD into the light of the second color, for example, light of a blue color. According to one or more embodiments, when the first sub-pixel SPXL1 is the blue pixel (or the blue sub-pixel), a light scattering layer including light scattering particles SCT may be provided instead of the color conversion layer CCL including the color conversion particles QD. For example, when the light emitting elements LD emit blue-based light, the first sub-pixel SPXL1 may include the light scattering layer including the light scattering particles SCT. The above-described light scattering layer may be omitted according to one or more embodiments. According to one or more embodiments, when the first sub-pixel SPXL1 is the blue pixel (or the blue sub-pixel), a transparent polymer may be provided instead of the color conversion layer CCL.

A fourth insulating layer INS4 may be positioned on the color conversion layer CCL and the second bank BNK2.

The fourth insulating layer INS4 may be entirely (or completely) provided in the display area DA (or a pixel area), in which each of the first, second, and third pixels PXL1, PXL2, and PXL3 is positioned, to cover the second bank BNK2 and the color conversion layer CCL. The fourth insulating layer INS4 may be directly disposed on the second bank BNK2 and the color conversion layer CCL. The fourth insulating layer INS4 may be an inorganic insulating layer including an inorganic material. The fourth insulating layer INS4 may include at least one of silicon nitride (SiN$_x$), silicon oxide (SiO$_x$), and silicon oxynitride (SiO$_x$N$_y$), and may include at least one of a metal oxide such as aluminum oxide (AlO$_x$). The fourth insulating layer INS4 may completely cover the second bank BNK2 and the color conversion layer CCL to prevent water, moisture, or the like from flowing into the display element layer DPL from the outside.

The fourth insulating layer INS4 may have a flat surface alleviating a step difference generated by components disposed thereunder. For example, the fourth insulating layer INS4 may include an organic insulating layer including an organic material. The fourth insulating layer INS4 may be a common layer commonly provided to the display area DA, but is not limited thereto.

A color filter layer CFL may be provided and/or formed on the fourth insulating layer INS4.

In the embodiment of FIG. 14, the color filter layer CFL may include color filters CF corresponding to each color of adjacent sub-pixels. For example, the color filter layer CFL may include a first color filter CF1 disposed on the color conversion layer CCL of the first sub-pixel SPXL1, a second color filter CF2 disposed on the color conversion layer CCL of one sub-pixel adjacent to the first sub-pixel SPXL1 in the first direction DR1, and a third color filter CF3 disposed on the conversion layer CCL of another sub-pixel adjacent to the first sub-pixel SPXL1 in the first direction DR1. In one or more embodiments, the first, second, and third color filters CF1, CF2, and CF3 may be disposed to overlap each other in the non-emission area NEMA to block light interference between adjacent sub-pixels. Each of the first, second, and third color filters CF1, CF2, and CF3 may include a color filter material that selectively transmits the light of the specific color converted by the color conversion layer CCL. For example, the first color filter CF1 may be a red color filter, the second color filter CF2 may be a green color filter, and the third color filter CF3 may be a blue color filter. The above-described color filters CF may be provided on one surface of the fourth insulating layer INS4 to correspond to the color conversion layer CCL.

In the embodiment of FIG. 15, the color filter layer CFL may include a first color filter CF1 and a light blocking pattern LBP. The first color filter CF1 may be positioned in the emission area of each of adjacent sub-pixels, and may be provided and/or formed on the fourth insulating layer INS4 on the color conversion layer CCL of the corresponding sub-pixel. The light blocking pattern LBP may be positioned in the non-emission area NEMA and may be provided and/or formed on the fourth insulating layer INS4 on the second bank BNK2 of the corresponding sub-pixel, for example, the first sub-pixel SPXL1. The light blocking pattern LBP may be positioned on one surface of the fourth insulating layer INS4 to be adjacent to the color filter CF. The light blocking pattern LBP may overlap the first and second banks BNK1 and BNK2. The light blocking pattern LBP may include a light blocking material that prevents a light leakage defect in which light is leaked between adjacent pixels PXL. For example, the light blocking pattern LBP may include a black matrix. The light blocking pattern LBP may prevent color mixing of light emitted from each of the adjacent pixels PXL.

An encapsulation layer ENC may be provided and/or formed on the color filter layer CFL.

The encapsulation layer ENC may include a fifth insulating layer INS5. The fifth insulating layer INS5 may be an inorganic insulating layer including an inorganic material or an organic insulating layer including an organic material. The fifth insulating layer INS5 may entirely cover configurations positioned thereunder, and may block water, moisture, or the like from flowing into the color filter layer CFL and the display element layer DPL from the outside.

In the display device ("each sub-pixel", or "each pixel PXL") according to the above-described embodiment, the color conversion layer CCL and the color filter CF may be disposed on the light emitting element LD. Therefore, light having excellent color reproducibility may be emitted through the color conversion layer CCL and the color filter CF, and thus light output efficiency may be improved.

In one or more embodiments, the fifth insulating layer INS5 may be formed as multiple layers. For example, the fifth insulating layer INS5 may include at least two inorganic insulating layers and at least one organic insulating layer interposed between the at least two inorganic insulating layers. However, a configuration material and/or a structure of the fifth insulating layer INS5 may be variously changed. In addition, according to one or more embodiments, at least one overcoat layer, a filler layer, an upper substrate, and/or the like may be further disposed on the fifth insulating layer INS5.

In the above-described embodiment, the color conversion layer CCL is directly formed on the first pixel electrode PE1, the first intermediate electrode CTE1, the second intermediate electrode CTE2, and the second pixel electrode PE2, but is not limited thereto. According to one or more embodiments, as shown in FIG. 16, the color conversion layer CCL may be formed on a separate substrate, for example, the upper substrate U_SUB, and may be combined with the display element layer DPL including the first pixel electrode PE1, the first intermediate electrode CTE1, the second intermediate electrode CTE2, and the second pixel electrode PE2 through the intermediate layer CTL.

The intermediate layer CTL may be a transparent adhesive layer (viscosity layer) for strengthening adhesive force between the display element layer DPL and the upper substrate U_SUB, for example, an optically clear adhesive, but is not limited thereto. According to one or more embodiments, the intermediate layer CTL may be a refractive index conversion layer for improving an emission luminance of the pixel PXL by converting a refractive index of light emitted from the light emitting elements LD and proceeding to the upper substrate U_SUB. According to one or more embodiments, the intermediate layer CTL may include a filler formed of an insulating material having an insulating property and an adhesive property.

The upper substrate U_SUB may configure an encapsulation substrate and/or a window member of the display device. The upper substrate U_SUB may include a base layer BSL (or a base substrate), the color conversion layer CCL, the color filter CF, light blocking patterns LBP1 and LBP2, and first and second capping layers CPL1 and CPL2.

The base layer BSL may be a rigid substrate or a flexible substrate, and a material or a property thereof is not particularly limited. The base layer BSL may be formed of the same material as the substrate SUB or may be formed of a material different from that of the substrate SUB.

In FIG. 16, the color conversion layer CCL and the color filter CF may be disposed on one surface of the base layer BSL to face (e.g., oppose) the display element layer DPL. The color filter CF may be provided on one surface of the base layer BSL to correspond to the color conversion layer CCL.

The first capping layer CPL1 may be provided and/or formed between the color filter CF and the color conversion layer CCL.

The first capping layer CPL1 may be disposed on the color filter CF to cover the color filter CF, thereby protecting the color filter CF. The first capping layer CPL1 may be an inorganic layer including an inorganic material or an organic layer including an organic material.

The light blocking patterns LBP1 and LBP2 may be positioned adjacent to the color conversion layer CCL and the color filter CF. The light blocking patterns LBP1 and LBP2 may be disposed on one surface of the base layer BSL to correspond to the non-emission area NEMA of the first sub-pixel SPXL1. The light blocking patterns LBP1 and LBP2 may include a first light blocking pattern LBP1 and a second light blocking pattern LBP2.

The first light blocking pattern LBP1 may be positioned on one surface of the base layer BSL and may be positioned adjacent to the color filter CF.

The first capping layer CPL1 may be provided and/or formed on the first light blocking pattern LBP1.

The second light blocking pattern LBP2 may be provided and/or formed on one surface of the first capping layer CPL1 to correspond to the first light blocking pattern LBP1. The second light blocking pattern LBP2 may be a black matrix. The first blocking pattern LBP1 and the second blocking pattern LBP2 may include the same material. In one or more embodiments, the second light blocking pattern LBP2 may be a structure that finally defines the first emission area EMA1 of the first sub-pixel SPXL1. The second light blocking pattern LBP2 may be a dam structure that finally defines the first emission area EMA1 to which the color conversion layer CCL is to be supplied in a step of supplying the color conversion layer CCL.

The second capping layer CPL2 may be entirely provided and/or formed on the color conversion layer CCL and the second light blocking pattern LBP2.

The second capping layer CPL2 may include at least one of silicon nitride ($SiN_x$), silicon oxide ($SiO_x$), and silicon oxynitride ($SiO_xN_y$), or include at least one of a metal oxide such as aluminum oxide ($AlO_x$), but is not limited thereto. According to one or more embodiments, the second capping layer CPL2 may be formed of an organic layer including an organic material. The second capping layer CPL2 may be disposed on the color conversion layer CCL to protect the color conversion layer CCL from external water, moisture, and the like, thereby further improving reliability of the color conversion layer CCL.

The above-described upper substrate U_SUB may be combined with the display element layer DPL using the intermediate layer CTL. An auxiliary insulating layer AUINS may be positioned between the upper substrate U_SUB and the display element layer DPL. The auxiliary insulating layer AUINS may be positioned on the first pixel electrode PE1, the first intermediate electrode CTE1, the second intermediate electrode CTE2, and the second pixel electrode PE2 in the first emission area EMA1 to cover the first pixel electrode PE1, the first intermediate electrode CTE1, the second intermediate electrode CTE2, and the second pixel electrode PE2. The auxiliary insulating layer AUINS may be positioned on the second bank BNK2 in the non-emission area NEMA positioned around the first emission area EMA1 to cover the second bank BNK2.

The above-described auxiliary insulating layer AUINS may include the same material as the first and second capping layers CPL1 and CPL2 or may include one or more materials selected from materials exemplified as the configuration material of the first and second capping layers CPL1 and CPL2.

Although the present disclosure has been described with reference to the embodiment above, those skilled in the art or those having a common knowledge in the art will understand that the present disclosure may be variously modified and changed without departing from the features and technical area of the present disclosure described in the claims which will be described later.

Therefore, the technical scope of the present disclosure should not be limited to the contents described in the detailed description of the specification, but should be defined by the claims.

What is claimed is:

1. A pixel comprising:
an emission area and a non-emission area;
a first pixel electrode, a first intermediate electrode, a second intermediate electrode, and a second pixel electrode spaced from each other;
first light emitting elements, each of the first light emitting elements comprising a first end electrically connected to the first pixel electrode and a second end electrically connected to the first intermediate electrode;
second light emitting elements, each of the second light emitting elements comprising a first end electrically connected to the first intermediate electrode and a second end electrically connected to the second intermediate electrode; and
third light emitting elements, each of the third light emitting elements comprising a first end electrically connected to the second intermediate electrode and a second end electrically connected to the second pixel electrode,
wherein the second intermediate electrode comprises a first portion opposing the first intermediate electrode, a second portion located between the first pixel electrode and the second pixel electrode, and a diagonal line portion located between the first portion and the second portion, and
wherein the first and second portions are located in columns that are different from each other and have a bar shape having a uniform width in an extension direction, wherein the diagonal line portion has a shape that is different from that of each of the first and second portions.

2. The pixel according to claim 1, wherein the diagonal line portion connects the first portion and the second portion and extends in a direction different from the extension direction of each of the first and second portions.

3. The pixel according to claim 2, wherein the diagonal line portion has at least two different widths in the extension direction of the second intermediate electrode.

4. The pixel according to claim 2, wherein at least a portion of the first intermediate electrode surrounds at least one side of the first pixel electrode and is between the first pixel electrode and the second portion of the second intermediate electrode.

5. The pixel according to claim 4, wherein the first intermediate electrode comprises a first straight line portion opposing the first pixel electrode, a second straight line portion positioned between the first pixel electrode and the first portion of the second intermediate electrode, and a connection portion connecting the first straight line portion and the second straight line portion, and

wherein the first straight line portion and the second straight line portion are in the emission area, and the connection portion is in the non-emission area.

6. The pixel according to claim 5, wherein the first light emitting elements form a first series stage in which the first light emitting elements are connected in parallel between the first pixel electrode and the first intermediate electrode,
wherein the second light emitting elements form a second series stage in which the second light emitting elements are connected in parallel between the first intermediate electrode and the first portion of the second intermediate electrode, and
wherein the third light emitting elements form a third series stage in which the third light emitting elements are connected in parallel between the second portion of the second intermediate electrode and the second pixel electrode.

7. The pixel according to claim 6, wherein the second light emitting elements and the third light emitting elements are positioned to correspond to a same column in a plan view.

8. The pixel according to claim 6, wherein the first end of each of the first, second, and third light emitting elements comprises a P-type semiconductor layer, and the second end of each of the first, second, and third light emitting elements comprises an N-type semiconductor layer.

9. The pixel according to claim 8, wherein some of the first light emitting elements are adjacent to the third light emitting elements, and rest of the first light emitting elements are adjacent to the second light emitting elements,
wherein first ends of the some of the first light emitting elements oppose the first end of the third light emitting elements, and
wherein first ends of the rest of the first light emitting elements oppose the first end of the second light emitting elements.

10. The pixel according to claim 9, wherein the first end of each of the first light emitting elements, the first end of each of the second light emitting elements, and the first end of each of the third light emitting elements are adjacent to a center of the emission area, in a plan view.

11. The pixel according to claim 8, wherein the first pixel electrode, the first intermediate electrode, the second intermediate electrode, and the second pixel electrode are formed by the same process and located at a same layer.

12. The pixel according to claim 8, wherein the first pixel electrode and the second pixel electrode are formed by different processes and located at different layers, and
wherein the first intermediate electrode and the second intermediate electrode are formed by different processes and located at different layers.

13. The pixel according to claim 12, wherein the first pixel electrode and the second intermediate electrode are provided in a same layer, and the first intermediate electrode and the second pixel electrode are provided in a same layer.

14. The pixel according to claim 8, further comprising:
a first alignment electrode under each of the first pixel electrode, the second straight line portion of the first intermediate electrode, and the second portion of the second intermediate electrode, and electrically connected to the first pixel electrode;
a second alignment electrode under the first straight line portion of the first intermediate electrode and overlapping the first intermediate electrode; and a third alignment electrode under each of the first portion of the second intermediate electrode and the second pixel electrode, and electrically connected to the second pixel electrode.

15. The pixel according to claim 14, wherein a first alignment signal is applied to the first alignment electrode, and a second alignment signal is applied to the second and third alignment electrodes before the first, second, and third light emitting elements are located in the emission area, wherein the first alignment signal and the second alignment signal are different from each other, and wherein the first alignment signal is an AC signal, and the second alignment signal is a ground voltage.

16. The pixel according to claim 15, further comprising:

a bank in the non-emission area and including a first opening corresponding to the emission area and a second opening spaced from the first opening; and an insulating layer on the first alignment electrode, the second alignment electrode, and the third alignment electrode, and comprising a first contact portion exposing a portion of the first alignment electrode and a second contact portion exposing a portion of the third alignment electrode.

17. The pixel according to claim 16, wherein the first contact portion and the second contact portion are in the second opening.

18. The pixel according to claim 16, further comprising:

a substrate;

a storage capacitor on the substrate and electrically connected to the first end of each of the first light emitting elements;

at least one transistor on the substrate and electrically connected to the storage capacitor;

a first power line on the substrate, electrically connected to the transistor, and configured to receive a voltage of first driving power;

a second power line on the substrate, electrically connected to the second end of each of the third light emitting elements, and configured to receive a voltage of second driving power; and a passivation layer on the transistor, the first power line, and the second power line and exposing each of a portion of the storage capacitor, a portion of the first power line, and a portion of the second power line.

19. The pixel according to claim 16, further comprising:

a color conversion layer on the first and second pixel electrodes and the first and second intermediate electrodes in the emission area, and configured to convert light of a first color emitted from each of the first to third light emitting elements into light of a second color; and a color filter on the color conversion layer and configured to selectively transmit the light of the second color.

20. A display device comprising:

a substrate including a display area and a non-display area; and a plurality of pixels in the display area, each of the plurality of pixels including an emission area and a non-emission area, wherein each of the plurality of pixels comprises:

a first pixel electrode and a second pixel electrode spaced from each other;

a first intermediate electrode spaced from the first and second pixel electrodes and surrounding at least one side of the first pixel electrode;

a second intermediate electrode spaced from the first pixel electrode, the second pixel electrode, and the first intermediate electrode, and comprising a first portion opposing the first intermediate electrode, a second portion located between the first pixel electrode and the second pixel electrode, and a connection portion located between the first portion and the second portion;

first light emitting elements, each of the first light emitting elements comprising a first end electrically connected to the first pixel electrode and a second end electrically connected to the first intermediate electrode;

second light emitting elements, each of the second light emitting elements comprising a first end electrically connected to the first intermediate electrode and a second end electrically connected to the second intermediate electrode;

third light emitting elements, each of the third light emitting elements comprising a first end electrically connected to the second intermediate electrode and a second end electrically connected to the second pixel electrode;

a first alignment electrode under the first pixel electrode, one area of the first intermediate electrode, and the second portion of the second intermediate electrode, and overlapping each of the first pixel electrode, the one area of the first intermediate electrode, and the second portion of the second intermediate electrode;

a second alignment electrode under another area of the first intermediate electrode, and overlapping the other area of the first intermediate electrode; and a third alignment electrode under the first portion of the second intermediate electrode and the second pixel electrode, and overlapping the first portion of the second intermediate electrode and the second pixel electrode, wherein the first and second portions are located in different columns and have a bar shape having a uniform width in an extension direction, and wherein the connection portion has a shape different from that of each of the first and second portions.

* * * * *